(12) United States Patent
Morimoto et al.

(10) Patent No.: US 6,809,582 B2
(45) Date of Patent: Oct. 26, 2004

(54) SEMICONDUCTOR DEVICE INCLUDING A DIFFERENTIAL TRANSISTOR PAIR

(75) Inventors: Yasuo Morimoto, Hyogo (JP); Toshio Kumamoto, Hyogo (JP); Takashi Okuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/615,932

(22) Filed: Jul. 10, 2003

(65) Prior Publication Data

US 2004/0189350 A1 Sep. 30, 2004

(30) Foreign Application Priority Data

Mar. 28, 2003 (JP) ........................................ 2003-090523

(51) Int. Cl.[7] .............................. G06G 7/12; G06G 7/26
(52) U.S. Cl. ........................ 327/563; 327/502; 330/253
(58) Field of Search .................... 327/52, 89, 502–505, 327/560–566, 584–585; 330/253, 277, 287, 308

(56) References Cited

U.S. PATENT DOCUMENTS

| | | | | |
|---|---|---|---|---|
| 4,812,780 A | * | 3/1989 | Zimmerman | 330/253 |
| 4,977,378 A | * | 12/1990 | Tero | 330/258 |
| 5,091,663 A | * | 2/1992 | Ishizaki et al. | 330/253 |
| 5,886,578 A | * | 3/1999 | Miyashita et al. | 330/253 |
| 5,898,341 A | * | 4/1999 | Miyashita | 330/253 |
| 6,714,082 B2 | * | 3/2004 | Miyazawa | 330/308 |

FOREIGN PATENT DOCUMENTS

| | | |
|---|---|---|
| JP | 2000-236237 | 8/2000 |
| JP | 2002-141421 | 5/2002 |

* cited by examiner

*Primary Examiner*—My-Trang Nu Ton
(74) *Attorney, Agent, or Firm*—Burns, Doane, Swecker & Mathis, L.L.P.

(57) ABSTRACT

Two groups of diodes are connected to internal lines transmitting complementary signals, respectively, and positions of the centers of gravity of the groups of diodes are made coincident with each other. A circuit capable of preventing the deviation of the characteristics of differential transistor pair caused by an antenna effect and highly immune against a substrate noise can be achieved.

20 Claims, 18 Drawing Sheets

SEMICONDUCTOR DEVICE INCLUDING A DIFFERENTIAL TRANSISTOR PAIR

BACKGROUND OF THE INVENTION

1. Field of the Invention

The present invention relates to a semiconductor device, in particular to a semiconductor device including transistors forming a differential pair. More particularly, the present invention relates to an arrangement of diodes for providing protection against the change in characteristics of the transistors forming the differential pair.

2. Description of the Background Art

In a differential amplifier, a mixer and others, a differential transistor pair operating in a differential manner is arranged at an input stage for processing a differential input. It is generally known that even a minute difference in characteristics in such a differential transistor pair would cause various problems such as an offset voltage. In particular, when there is a difference in threshold voltage and/or drain current of transistors employed in the differential pair at the input section, a significant problem frequently occurs with regard to circuit characteristics.

To avoid the occurrence of difference in transistor characteristics, attentions are often paid in creating a layout, such as to align the centroid positions of transistor elements. However, some issues remain unresolved only through the measure on the transistor layout. One of such issues is the problem of characteristics degradation called antenna effect, which is discussed in Japanese Patent Laying-Open No. 2002-141421, for example. In manufacture of the semiconductor device that includes an MOS transistor (Insulated Gate Field Effect Transistor) as a component, charge stress is applied to an interconnection layer during a plasma process. The charge stress negatively affects the characteristics of the MOS transistor, which is referred to the antenna effect.

Specifically, in the manufacturing process of semiconductor devices, especially in an interconnection step, plasma etching is often used to pattern an interconnection layout into a desired geometry. In the plasma etching step, plasma charged particles are accumulated on a patterned metal line and the metal line turns into a charged-up state. When the metal line is connected to a gate of an MOS transistor via a contact hole, charged-up plasma charged particles flow into and are accumulated on a gate electrode layer which is formed, for example, of polysilicon. Because of the electric charges accumulated on the gate electrode layer, the electric potential of the gate surface rises to create a large electrical potential difference across a gate insulation film located under the gate electrode layer, whereby a large voltage stress is applied onto the gate insulation film.

Because of the voltage stress, the gate insulation film would be broken down. Even if such break down would not occur, because of the electric field created by the electric potential difference across the gate insulation film, electrons would be sometimes trapped in the gate insulation film, whereby the characteristics of the MOS transistor after the manufacturing, such as the threshold voltage Vth and drain current Ids would change. Such phenomenon is called antenna effect. The degree of influence by such effect depends on the ratio (antenna ratio) of an area of the interconnection layer on which plasma charged particles generated during the plasma etching are accumulated to an area of the gate insulation film.

The antenna effect can occur at any transistors. However, the degree of the change of characteristics of the transistor varies according to the feature of the metal interconnection section connected to the transistor and is not same for all transistors. At the input stage of the differential circuit, a combination of transistors with identical characteristics, in other words, matched characteristics, is required for achieving an accurate differential operation. When a phenomenon due to the antenna effect occurs at the input stage of such differential circuit, the characteristics of the differential circuit is significantly degraded. To prevent such characteristics degradation, the following two solutions are proposed in the above-referenced patent publication:

(1) to make the length and other features of the metal lines connected to the transistors of differential circuit input stage the same; and (2) to connect a diode for discharging electric charges at the gate of each transistor in the input stage of the differential circuit.

The above-referenced patent publication discloses provision of dummy interconnection lines in the arrangement for discharging the accumulated electric charges to a substrate region through the diode, to make identical the lengths of interconnection lines of input signals to the differential stage transistors. However, such arrangement requires the region for placing the dummy interconnection lines to increase the interconnection area. In addition, depending on the layout, such dummy interconnection could not placed in some cases. If the dummy interconnection lines should be laid out, the circuit layout may be negatively limited, whereby the efficient arrangement of transistors and interconnection line could not be achieved.

As described in the above-referenced patent publication, it is possible to suppress the degradation of transistor characteristics through the discharge of the electric charges accumulated during plasma etching to the substrate region by connecting the diodes to the gates of differential pair transistors. However, as the substrate region is utilized as one electrode of the diode, the noise generated in the substrate region is transmitted to a differential stage input signal line via the diode, to be superimposed onto an input signal, thereby impeding the accurate differential amplification of the input signals.

It could not be predicted where the noise of interest is generated in a semiconductor circuit device. Noise is generated in a region outside the circuit including the differential stage and transmitted to the substrate region. As the generation source of such noise, various circuits/ interconnection lines can be considered, including a digital circuit, a high frequency circuit and a power source line. Although the noise is partially attenuated during its propagation through the substrate, it is significantly amplified when it is input to differential pair transistors, which amplify a minute potential difference, via a capacitance component of the diode. If the magnitude of noise applied to the differential inputs of the differential pair transistors are equal with each other, the noise can be cancelled out through the function of common mode component rejection of the differential stage.

However, the distances from the noise source to the diodes are not always the same. If the distances from the noise source to the diodes arranged at the input of differential pair transistors are not the same, the magnitudes of noise will change accordingly. Therefore, the function of common mode rejection characteristic of the differential stage is not sufficient for the noise rejection and the residual noise will be amplified.

In the above-referenced patent publication, consideration is given only to the removal of plasma charged particles generated during the plasma etching process and no consideration is given to the influence of noise transmitted to the diodes via the substrate region.

SUMMARY OF THE INVENTION

An object of the present invention is to provide a semiconductor device capable of performing an accurate differential operation without being influenced by a substrate noise while matching the characteristics of a differential transistor pair.

Another object of the present invention is to provide a semiconductor device having a differential input stage with n excellent immunity against the antenna effect and the substrate noise.

A semiconductor device according to the present invention includes: a first transistor; a second transistor arranged electrically parallel with the first transistor; a first group of diodes including a plurality of diode elements connected electrically in parallel to a first terminal of the first transistor; and a second group of diodes including a plurality of diode elements connected in parallel electrically to a first terminal of the second transistor. A position of center of gravity made by diode elements in the first group of diodes overlaps with a position of center of gravity made by the diode elements in the second group of diodes.

As the diode elements are arranged such that the centers of gravity of diode elements included in the first and second groups of diodes overlap with each other, the first and second groups of diodes are subject to identical effect from the noise from any direction, and transmit the noise component of the same magnitude to the first terminals of the first and second transistors accordingly. Thus, the total amount of noise will be equal and noise rejection will be securely performed through the common mode rejection characteristics of the differential stage and the accurate differential operation will be achieved.

In addition, with the arrangement of the first and second groups of diodes, the change in transistor characteristics accompanying antenna effect on the first terminals of the first and second transistors can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
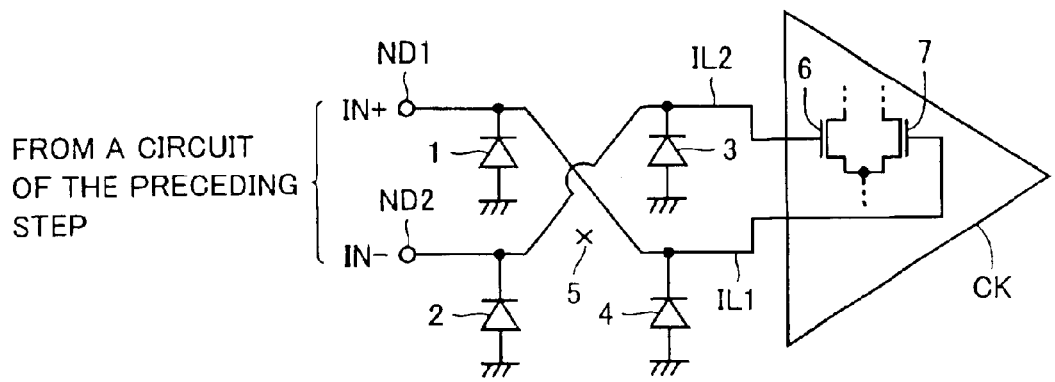
FIG. 1 schematically shows a configuration of a semiconductor device according to a first embodiment of the present invention.

FIG. 1 is a diagram schematically showing a configuration of a semiconductor device according to the first embodiment of the present invention. In FIG. 1, the semiconductor device includes an internal circuit CK receiving internal signals In+ and In− supplied to input nodes ND1 and ND2 from a circuit at a preceding stage via internal lines IL1 and IL2. Internal circuit CK includes differential transistors 6 and 7 at its input stage. Differential transistors 6 and 7 are each formed, for example, of an N channel MOS transistor (Insulated Gate Field Effect Transistor). A gate (a first terminal) of MOS transistor 6 is coupled with internal line IL2 and a gate (a first terminal) of MOS transistor 7 is coupled with internal line IL1. One conduction terminal (a source region; a second terminal) of each of MOS transistors 6 and 7 is commonly connected.

Internal circuit CK can take any configuration, as far as it includes a differential transistor pair at its input stage. Internal circuit CK may be a differential amplification circuit which differentially amplifies input signals In+ and IN−, or a mixer which mixes input signals In+ and IN−. In addition, one of input signals In+ and In− may be a reference voltage.

Nodes ND1 and ND2 are internal nodes, and receive input signals In+ and IN−, respectively, from a circuit at a preceding stage. The circuit at the preceding stage may be an input buffer circuit or an internal circuit performing a predetermined operation. The circuit at the preceding stage may be any circuit as far as it generates differential signals In+ and IN−.

Internal lines IL1 and IL2 are, for example, formed of a metal line, such as aluminum line or copper line, of a material on which plasma charged particles will be accumulated during plasma etching in the patterning. Diodes 1 and 4 are connected to internal line IL1 while diodes 2 and 3 are connected to internal line IL2. These diodes 1–4 are each connected to be in a reverse bias state. FIG. 1 shows diodes 1–4 each having a cathode connected to internal line IL1 or IL2 and an anode coupled to ground.

As will be described in detail below, diodes 1–4 have the same size, in other words, the same area and a center of gravity of a region including diodes 1 and 4 arranged along a diagonal line coincides with a center of gravity of a region including diodes 2 and 3 arranged along another diagonal line. Such arrangement where the center of gravity of diodes 1 and 4 coincides with the center of gravity of diodes 2 and 3 is called "common centroid arrangement".

Among diodes 1–4, the diodes arranged along the same diagonal line are connected to the common internal line. Hence, the magnitude of the noise becomes the same for both internal lines IL1 and IL2 regardless of the direction of noise propagation, common mode noise components of the same magnitude is superimposed onto internal lines IL1 and IL2, and the common mode component is cancelled out by MOS transistors 6 and 7. In addition, even when electric charges are accumulated on internal lines IL1 and IL2 during the plasma etching process, electric charges will be discharged to the substrate region by diodes 1–4, whereby the antenna effect will be suppressed.

Figure 2:
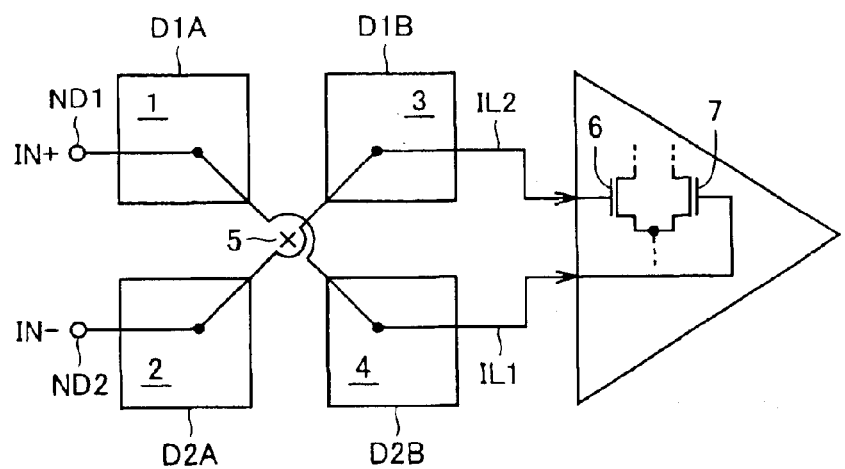
FIG. 2 schematically shows a planer layout of diodes shown in FIG. 1.

FIG. 2 is a diagram schematically showing a planar layout of diodes in FIG. 1. In FIG. 2, four rectangular-shaped impurity regions D1A, D1B, D2A and D2B are arranged in two rows by two columns in alignment. These four impurity regions D1A–D2B have the same size. Impurity regions D1A and D1B form one-side electrodes of diodes 1 and 3, respectively and impurity regions D2A and D2B form one-side electrodes of diodes 2 and 4, respectively. Each of another-side electrodes of these diodes 1–4 is provided by a substrate region on which these impurity regions D1A–D2B are formed.

Impurity regions D1A and D2B are electrically connected together via internal line IL1 and impurity regions D2A and D1B are connected together via internal line IL2. The center of gravity of impurity regions D1A and D2B is given at a position 5 and similarly the center of gravity of impurity regions D2A and D1B is given at position 5. In other words, when each of impurity regions D1A–D2B are formed by an impurity region of the same size (same area) and impurity regions located along the diagonal line are connected with each other, the center of gravity of diodes 1 and 4 connected to internal line IL1 and the center of gravity of diodes 2 and 3 connected to internal line IL2 can be coincident in position, whereby a common centroid arrangement can be achieved.

Figure 3:
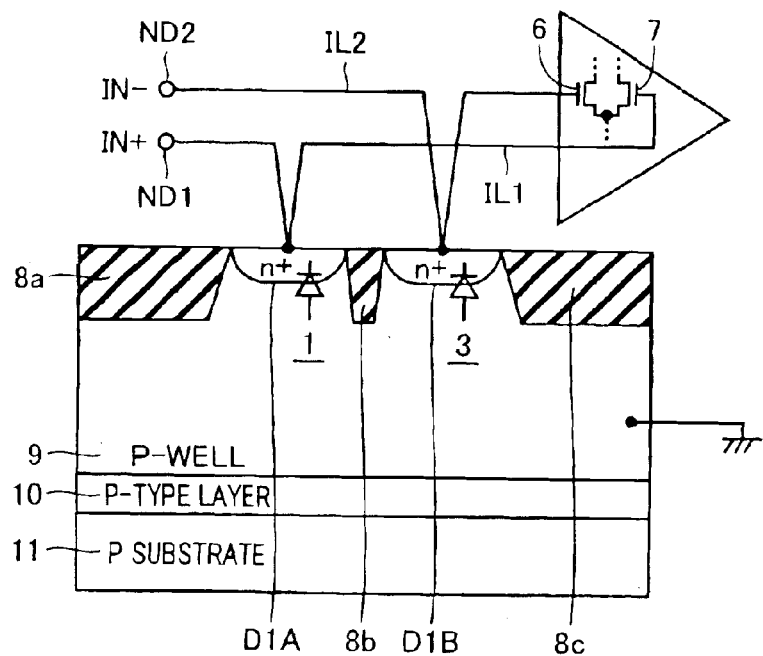
FIG. 3 schematically shows a sectional structure of diodes shown in FIG. 2.

FIG. 3 is a diagram schematically showing a sectional structure of diodes 1 and 3 shown in FIG. 2. In FIG. 3, a P-type layer 10 is formed on a surface of a P-type substrate 11. A P-well 9 is formed on P-type layer 10. On a surface of P-well 9, impurity regions D1A and D1B are formed at an interval. On either sides of impurity regions D1A and D1B, element isolation films (isolation insulation films) 8a and 8c are arranged and an element isolation film 8b is arranged between impurity regions D1A and D1B. Impurity regions D1A and D1B are N-type impurity regions, respectively and a PN junction is formed between each of impurity regions D1A and D1B and P-well 9, thereby forming a PN diode. P-well 9 is biased, for example, to the ground voltage.

P-well 9 may be provided dedicatedly as a region for forming diodes 1–4. In this case, other elements such as MOS transistors 6 and 7 are formed in a P-well or an N-well separately formed on P-type layer 10. Alternatively, P-well 9 may be employed as a substrate region for forming MOS transistors 6 and 7, and further, MOS transistors 6 and 7 may be formed on the surface of P-type layer 10.

Impurity region D1A is connected to the gate (a control electrode) of MOS transistor 6 via internal line IL2 and impurity region D1B is connected to the gate of MOS transistor 7 via internal line IL1. Hence, through the implantation of impurity into the surface of P-well 9, the impurity region of the same area can be easily formed in alignment and the centers of gravity of diodes connected to internal lines IL1 and IL2, respectively, can be made coincident in position.

When negative electric charges are accumulated on internal lines IL1 and IL2, PN diode will be biased in a forward direction in impurity regions D1A and D1B and the PN diode turns conductive and the negative electric charge will be absorbed by P-well 9. On the other hand, when positive electric charges are accumulated on internal lines IL1 and IL2, due to a backward leakage current in diodes 1 and 3, the positive electric charges will be absorbed by P-well 9. Hence, when the diodes are connected to internal lines IL1 and IL2, accumulated electric charges on internal lines IL1 and IL2 in a plasma etching process can be discharged. In normal operation, diodes 1–4 are in a reverse bias state and no adverse influence will be exerted on internal signals In+ and IN−.

The bias voltage of P-well 9 may be at any level as far as diodes 1–4 would be maintained in a reverse bias state. Hence, the well bias voltage is not limited to the ground voltage and can be, for example, a negative voltage.

Now, with reference to FIGS. 4 to 6, a noise immunity of the common centroid arrangement will be described.

Figure 4:
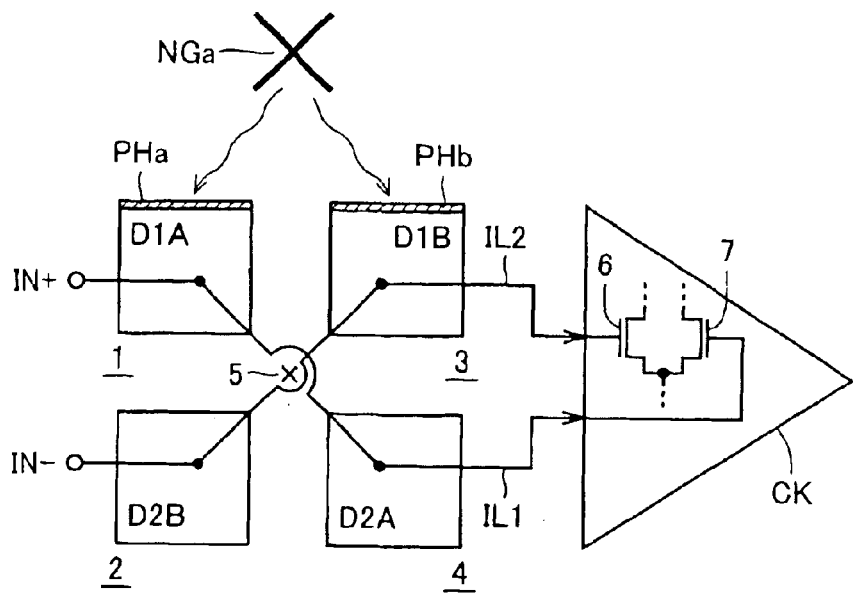
FIG. 4 schematically shows a noise-propagating region in the arrangement shown in FIG. 2.

As shown in FIG. 4, a noise source NGa is at an upper side, in the figure, of impurity regions D1A and D1B. Noise from noise source NGa is propagated via the substrate (P-well 9 or P-type layer 10 shown in FIG. 3). In this case, noise from noise source NGa is propagated to respective upper sides PHa and PHb of impurity regions D1A and D1B. Respective upper sides PHa and PHb of impurity regions D1A and D1B are of the same size with respect to the PN junction and the distances from noise source NGa to impurity regions D1A and D1B are substantially the same (as in the common centroid arrangement). Hence, the total amounts of the noise transmitted to the respective internal lines IL1 and IL2 via impurity regions D1A and D1B become the same. Common mode noises on internal lines IL1 and IL2 are cancelled by differential transistors 6 and 7 in internal circuit CK at the next stage and the influence of noise from noise source NGa on a differential amplification operation of internal signals In+ and In− is cancelled, consequently.

Figure 5:
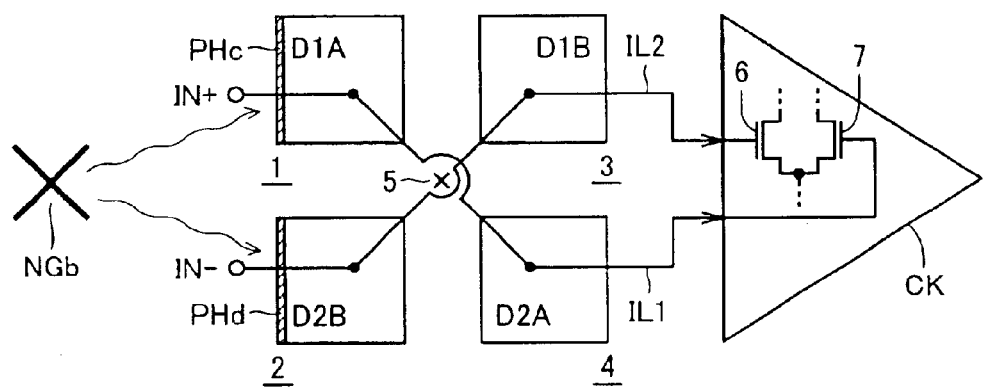
FIG. 5 schematically shows the noise-propagating region in an arrangement shown in FIG. 2.

As shown in FIG. 5, when noise source NGb exists on the left side of impurity regions D1A and D2B in the figure, noise from noise source NGb arrives left sides PHc and PHd of impurity regions D1A and D2B, respectively. These impurity regions D1A and D2B are of the same area, arranged symmetrically about the position 5 of the center of gravity, and have the sides PHc and PHd away from noise source NGb by substantially the same distance. Therefore, noise of substantially the same amount reach the left sides PHc and PHd of impurity regions D1A and D2B. Hence, even when noise from noise source NGb is propagated to internal lines IL1 and IL2 via impurity regions D1A and D2B, the total amount of noise for each is substantially the same. Consequently, common mode noises are cancelled by differential transistors 6 and 7 in internal circuit CK at the next stage, and the influence of the noise from noise source NGb on input signals In+ and In− is cancelled.

Figure 6:
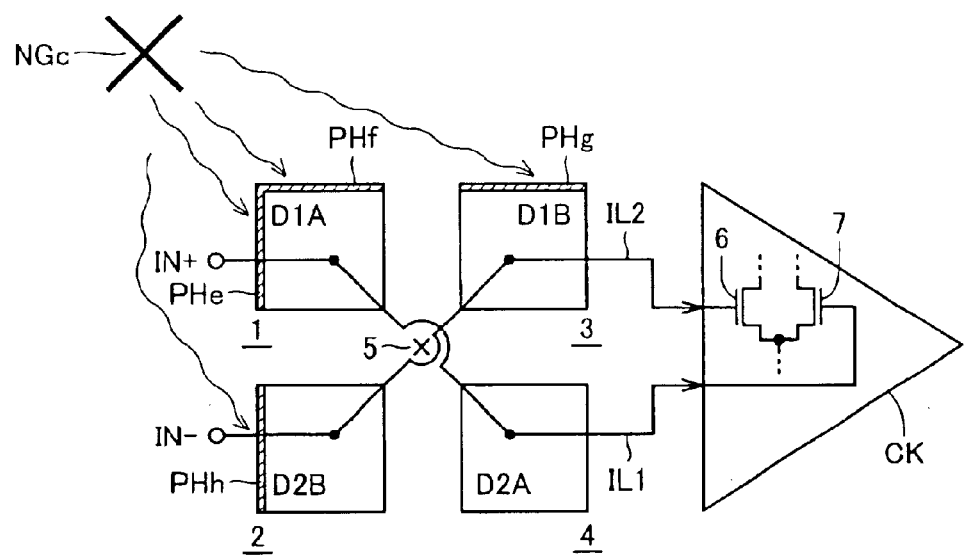
FIG. 6 schematically shows the noise-propagating region in the arrangement shown in FIG. 2.

As shown in FIG. 6, when noise source NGc exists in the upper left portion of the figure, the noise from noise source NGc reaches adjacent sides PHe and PHf of impurity region D1A and to an upper side PHg of impurity region D1B. Similarly, noise from noise source NGc reaches a left side PHh of impurity region D2B. Impurity regions D2B and D1B are connected to internal line IL2 and impurity region D1A is connected to internal line IL1. Hence, noise passing through two sides PHe and PHf of impurity region D1A is transmitted to internal line IL1 whereas noise transmitted via left side PHh of impurity region D2B and upper side PHg of impurity region D1B is transmitted to internal line IL2.

Hence, even though the distance from noise source NGc to impurity region D1A is different from the distances from noise source NGc to impurity regions D2B and D1B, noises from noise source NGc are identical in amount and phase at left side PHe of impurity region D1A and at left side PHh of impurity region D2B. In addition, noises from noise source NGc are identical in phase and magnitude at upper side PHf of impurity region D1A and at upper side PHg of impurity region D1B. Consequently, the noise transmitted to internal line IL1 and the noise transmitted to internal line IL2 are of the same phase and substantially of the same amount. Thus, because of the common mode rejection characteristics of differential transistors 6 and 7 in internal circuit CK at the next stage, noises on internal lines IL1 and IL2 are cancelled out. Thus, it is possible to accurately process input signals In+ and In− at internal circuit CK using differential transistors 6 and 7.

As shown in FIGS. 4 to 6, the centers of gravity of the groups of diodes connected respectively to internal lines IL1 and IL2 are made coincident in position. According to such common centroid arrangement, for any direction of the noise source NG (NGa–NGc) with respect to position 5 of center of gravity, the total amounts of noises propagated to internal lines IL1 and Il2 can be the same. Hence, these noises can be cancelled out at the next stage using the common mode rejection capability of differential transistors 6 and 7 in internal circuit CK at the next stage.

As described above, according to the first embodiment of the present invention, diodes are divided and arranged in common centroid arrangement for the gate interconnection lines of the differential transistor pair. Hence, the total amount of noise in the internal line transmitting a differential signal can be made identical regardless of the direction of the noise generation. Consequently, the noise can be securely cancelled out using the common mode rejection capability of the differential transistor pair and the stable operation of internal circuit can be achieved.

In addition, a diode is connected to an internal line connected to the control electrode of the MOS transistor and the "antenna effect" is suppressed to achieve an accurate differential operation.

Second Embodiment

Figure 7:
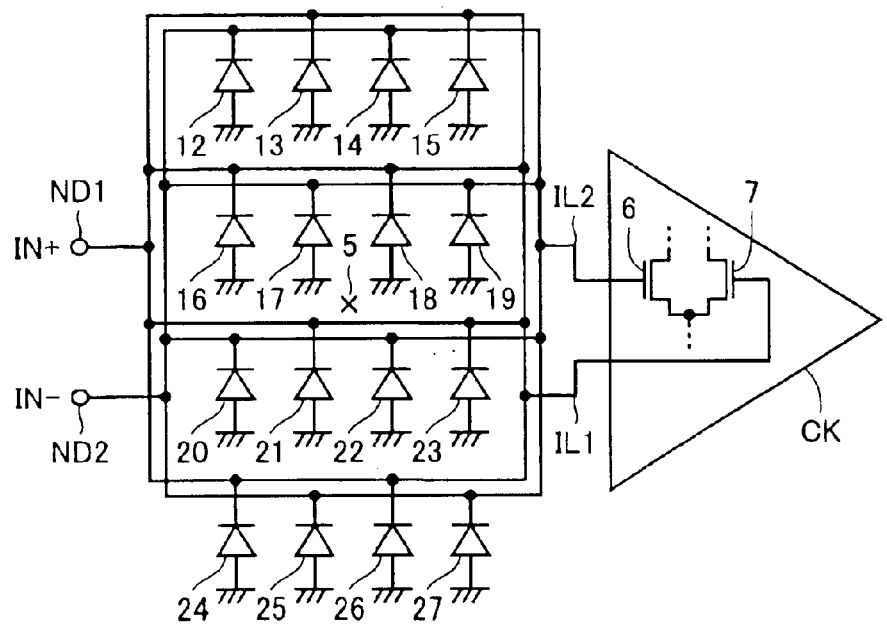
FIG. 7 shows a configuration of a semiconductor device according to a second embodiment of the present invention.

FIG. 7 is a diagram schematically showing a configuration of a semiconductor device according to the second embodiment of the present invention. In FIG. 7, diodes 12–27 are arranged in four rows by four columns in alignment. In a diode matrix constituted from diodes 12–27, diodes are alternately connected to internal lines IL1 and IL2 in a row direction and in a column direction, respectively. Hence, among diodes 12–15 in one row, diodes 12 and 14 are connected to internal line IL2 and diodes 13 and 15 are connected to internal line IL1. In a row of diodes 16–19, diodes 16 and 18 are connected to internal line IL1 and diodes 17 and 19 are connected to internal line IL2.

In the row of diodes 20–23, diodes 20 and 22 are connected to internal line IL2 and diodes 21 and 23 are connected to internal line IL1. In a row of diodes 24–26, diodes 24 and 26 are connected to internal line IL1 and diodes 25 and 27 are connected to internal line IL2. Internal lines IL1 and IL2 transmit input signals In+ and In− supplied to nodes ND1 and ND2, respectively, to the gates of differential MOS transistors 7 and 6 of internal circuit CK.

In such diode matrix, through the alternate connection of diodes to different internal lines, when diodes 12–27 are of the same size, the center of gravity formed by the group of diodes connected to internal line IL1 and the center of gravity formed by the group of diodes connected to internal line IL2 coincides at position 5, whereby the common centroid arrangement can be realized.

Figure 8:
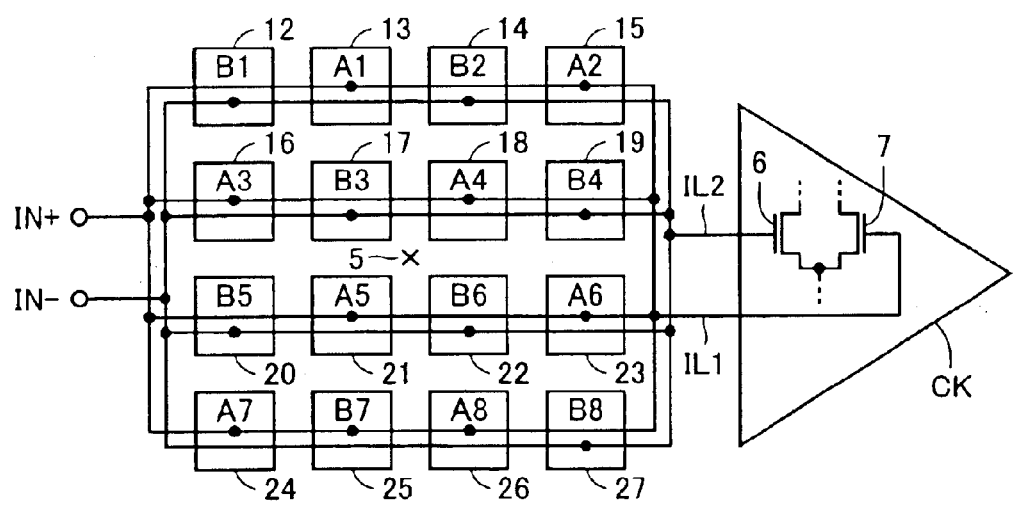
FIG. 8 schematically shows a planar layout of diodes shown in FIG. 7.

FIG. 8 is a diagram schematically showing a planar layout of a diode matrix shown in FIG. 7. In FIG. 8, impurity regions B1–B8 and A1–A8 are arranged in a matrix of four columns by four rows. These impurity regions B1–B8 and A1–A8 have the same area with each other. Impurity regions B1–B8 and A1–A8 are alternately arranged in a column direction and in a row direction. Hence, the center of gravity of impurity regions B1–B8 as a whole and the center of gravity of impurity regions A1–A8 as a whole coincide at position 5.

Impurity regions B1–B8 are connected to internal line IL2 to transmit input signal IN−, and impurity regions A1–A8 are connected to internal line IL1 to transmit input signal IN+.

Hence, through formation of diodes 12–27 with impurity regions B1–B8 and A1–A8, the influence of diodes connected to internal lines IL1 and IL2 can be divided, thus allowing more accurate equalization of the total amount of noise propagated to each of internal lines IL1 and IL2.

Figure 9:
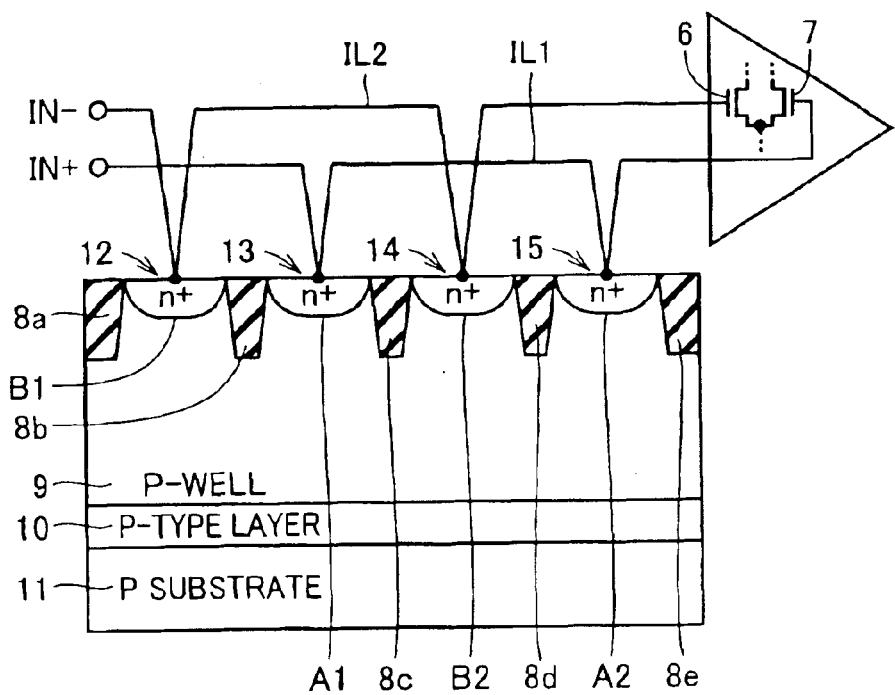
FIG. 9 schematically shows a sectional structure of diodes shown in FIG. 8.

FIG. 9 is a diagram schematically showing a sectional structure of diodes in one row of the diode matrix shown in FIG. 8. Also in FIG. 9, diodes 12–15 are formed in P-well 9 formed in the surface of P-type layer 10 on P substrate 11. Corresponding to each of diodes 12–15, n-type impurity regions B1, A1, B2 and A2 are formed, on the surface of P-well 9, being separated by element isolation regions 8b–8d. Outside impurity regions B1 and A2, element isolation regions 8a and 8e are formed.

Impurity regions B1 and B2 are connected to internal line IL2 and impurity regions A1 and A2 are connected to internal line IL1. Internal line IL1 is connected to the gate of MOS transistor 7 whereas internal line IL2 is connected to the gate of MOS transistor 6.

Diodes 12–15 are formed by PN junctions between respective n-type impurity regions and P-well 9. P-well 9 is biased, for example, to the ground voltage. Hence, by providing these impurity regions B1, A1, B2 and A2 of the same area, the positions of the centers of gravity of the groups of diodes connected respectively to internal lines IL1 and IL2 can easily be made coincident.

As described so far, a plurality of diodes arranged in a matrix are divided into two groups and each group of diodes is connected as a unit to an internal line forming the differential signal line pair. Hence, diodes are arranged in the common centroid arrangement, and for any noise source existing in any position to propagate a noise in any direction to the diode matrix, the total amounts of noise propagated to the internal lines can be correctly made equal and the cancellation of noise component can be secured.

Third Embodiment

Figure 10:
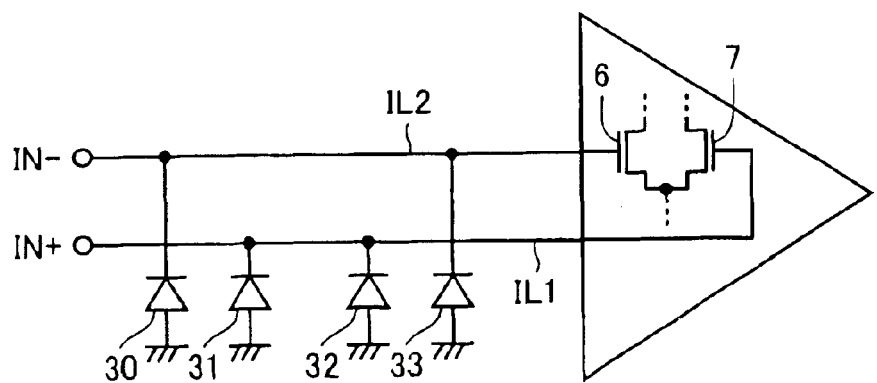
FIG. 10 schematically shows a configuration of a semiconductor device according to a third embodiment of the present invention.

FIG. 10 is a diagram schematically showing a configuration of a semiconductor device according to the third embodiment of the present invention. In the configuration as shown in FIG. 10, diodes 30 to 33 are arranged in a line. Diodes 30 and 33 located at either ends of the diode line are connected to internal line IL2 whereas diodes 31 and 32 located inside the diode line are connected to internal line IL1. Internal lines IL1 and IL2 transmit input signals In+ and IN−, respectively, to the gates of differential MOS transistors 7 and 6. Also in the configuration as shown in FIG. 10, diodes 30 to 33 have the same area and are arranged in the common centroid manner.

Figure 11:
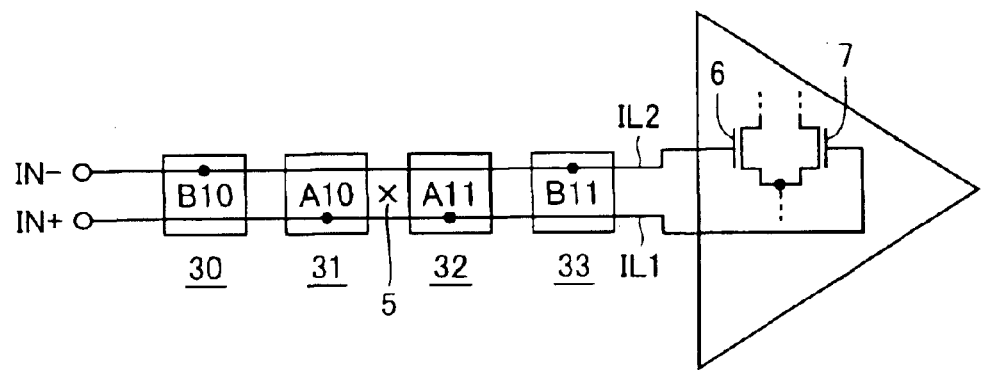
FIG. 11 schematically shows a planar layout of diodes shown in FIG. 10.

FIG. 11 is a diagram schematically showing a planar layout of the diode line shown in FIG. 10. In FIG. 11, impurity regions B10, A10, B11 and A11 are arranged in alignment in a line. These impurity regions B10, A10, B11 and A11 are of the same area. Impurity regions B10 and B11 correspond respectively to diodes 30 and 33 and are connected to internal line IL2. Impurity regions A10 and A11 correspond to diodes 31 and 32 and are connected to internal line IL1.

Hence, the position of the center of gravity of impurity regions 30 and 33 as a whole and the position of the center of gravity of impurity regions 31 and 32 as a whole can be given by the position 5. Thus, the common centroid arrangement is realized, wherein the sum of the length of the sides receiving the noise of each group of diodes is equal for the noise from any direction and the noise of the same amount is propagated via impurity regions 30 and 33, 31 and 32, and the noise of the same total amount is propagated accordingly to internal lines IL1 and IL2.

Figure 12:
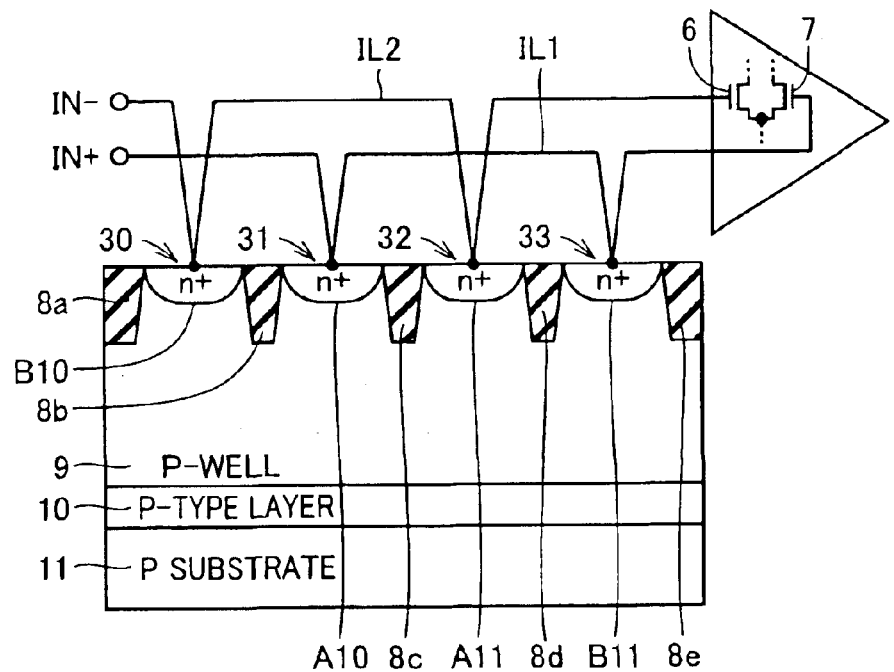
FIG. 12 schematically shows a sectional structure of diodes shown in FIG. 11.

FIG. 12 is a diagram schematically showing the sectional structure of diodes 30 to 33 as shown in FIG. 11. In FIG. 12, on the surface of P-well 9, n-type impurity regions B10, A10, A11 and B11 are formed being separated from each other by element isolation regions 8b–8d. Outside impurity regions B10 and B11, element isolation films 8a and 8e are formed. These impurity regions A11, A12, B11 and B12 are of the same layout area.

Impurity regions B10 and B11 are connected to internal line IL1 and impurity regions A10 and A11 are connected to internal line IL2. These impurity regions B10, A10, A11 and B11 each implement a diode structure by a PN junction formed with P-well 9. Thus, a noise propagated via P-well 9, is propagated to the internal line via the PN junction portion. Hence, when the size of impurity regions B10, B11, A10 and A11 are the same with each other, the sum of the area of PN junction receiving the noise becomes equal for all groups of diodes regardless of the direction of noise propagation, whereby the total amounts of the noise propagated to internal lines IL1 and IL2 become equal to each other.

Further, on the surface of P-well 9 formed on the surface of P-type layer 10, impurity regions B10, A10, A11 and B11 are simply arranged. Hence, these impurity regions can be easily made equal in area to make identical the positions of the center of gravity of diodes connected to internal lines IL1 and IL2.

In addition, in this case, the diode elements are arranged simply in a line, the area required for the arrangement of diode array can be reduced compared with the case where diode elements are arranged in a two dimensional matrix.

Further in the structure as shown in FIG. 12, P-type layer 10 is formed on P substrate 11. As a well structure, a twin-well structure or a triple well structure may be used.

Fourth Embodiment

Figure 13:
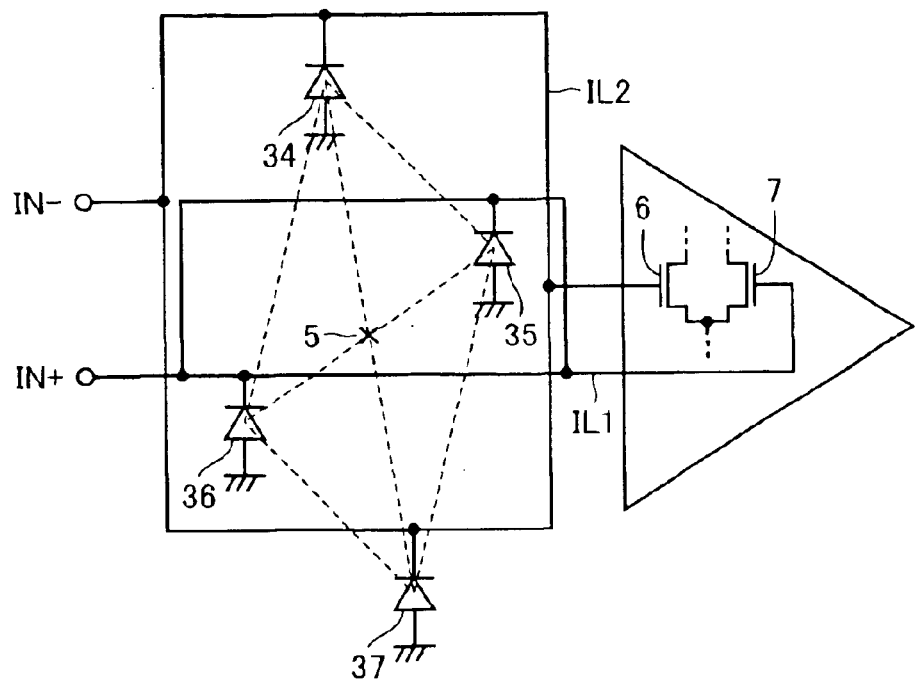
FIG. 13 schematically shows a structure of a semiconductor device according to a fourth embodiment of the present invention.

FIG. 13 is a diagram schematically showing a configuration of a semiconductor device according to the fourth embodiment of the present invention. In the arrangement as shown in FIG. 13, diodes 34–37 are arranged corresponding to the positions of the apexes of a rectangle, respectively. Diodes 34 and 37 located opposite on a diagonal line of the rectangle are connected to internal line IL2, whereas diodes 35 and 36 arranged opposite on another diagonal line of the rectangle are connected to internal line IL1. These internal lines IL1 and IL2 transmit input signals In+ and In− to the gates of differential MOS transistors 7 and 6, respectively.

Diodes 34–37 are of the same size and the position of the center of gravity formed by diodes 34 and 37 coincides with the position of the center of gravity of diodes 35 and 36 at position 5.

Figure 14:
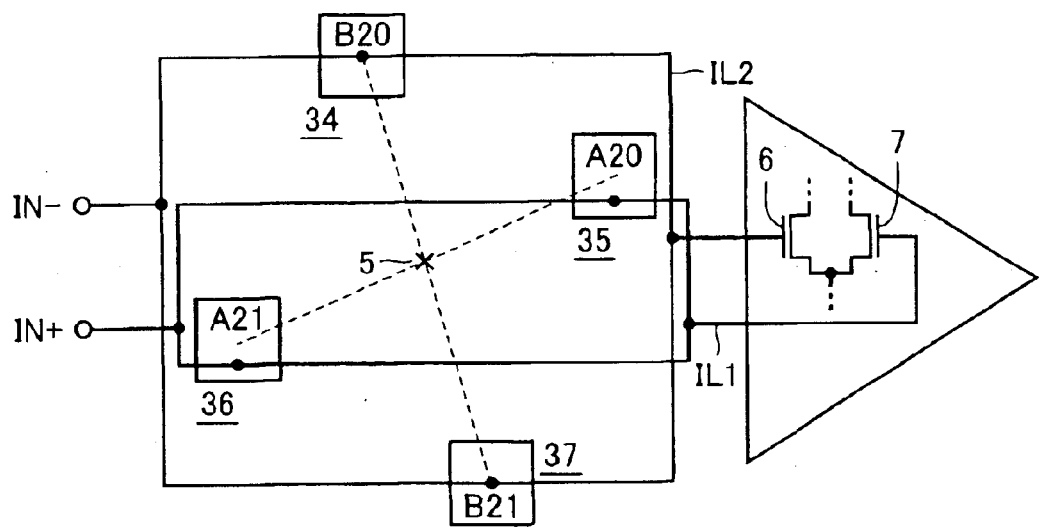
FIG. 14 schematically shows a planar layout of diodes shown in FIG. 13.

FIG. 14 is a diagram schematically showing a planar layout of the arrangement of diodes shown in FIG. 13. Diodes 34 and 37 include impurity region B20 and B21, respectively and diodes 35 and 36 include impurity regions A20 and A21, respectively. Impurity regions B20 and B21 are connected together via internal line IL2 and impurity regions A20 and A21 are connected to internal line IL1.

These impurity regions B20, B21, A20 and A21 are n-type impurity regions formed separately from each other on the surface of P-well 9. Diodes 34–37 are each formed by a PN junction between a respective impurity region and P-well 9. By making the area of these impurity regions B20, B21, A20 and A21 the same, the center of gravity formed by impurity regions A20 and A21 coincides with the center of gravity formed by impurity regions B20 and B21 at position 5.

As shown in FIGS. 13 and 14, diode elements are arranged, in a distributed manner, corresponding to the apexes of the rectangle and the diodes arranged opposite on the diagonal line are connected to a common internal line. Thus, the common centroid arrangement is easily achieved. Hence, regardless of the direction of the noise propagation, the amounts of noise transmitted to internal lines IL1 and IL2 via diodes 34 to 37 become equal, allowing the cancellation of the noise by differential MOS transistors 6 and 7, whereby the secure suppression of the noise influence is achieved.

In addition, as the diode elements are arranged at the apexes of a rectangle, the position of the center of gravity can easily be set to the intersection of the diagonal lines.

Fifth Embodiment

Figure 15:
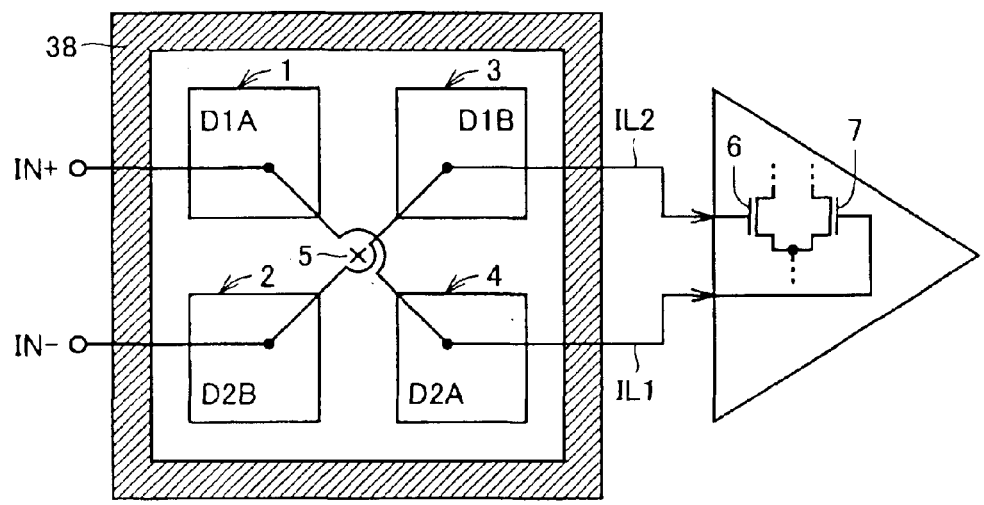
FIG. 15 schematically shows a planar layout of a semiconductor device according to a fifth embodiment of the present invention.

FIG. 15 is a diagram schematically showing a configuration of a semiconductor device according to the fifth embodiment of the present invention. The semiconductor device shown in FIG. 15 is different in configuration from the semiconductor device shown in FIG. 1 in the following points. An impurity region 38 is continuously formed so as to surround impurity regions D1A, D1B, D2B and D2A respectively forming diodes 1–4. Impurity region 38 has the same conductivity type as the well region (substrate region) where impurity regions D1A, D1B, D2B, D2A are formed for constituting diodes 1–4. As shown in FIG. 1, diodes 1–4 are each set to a reverse biased state and the well region is fixed, for example, to the ground voltage. Hence, also in impurity region 38, the well region is fixed to the same bias voltage and functions as a noise absorption layer for preventing a noise from being transmitted to diodes 1–4 via the well of the substrate region.

Figure 16:
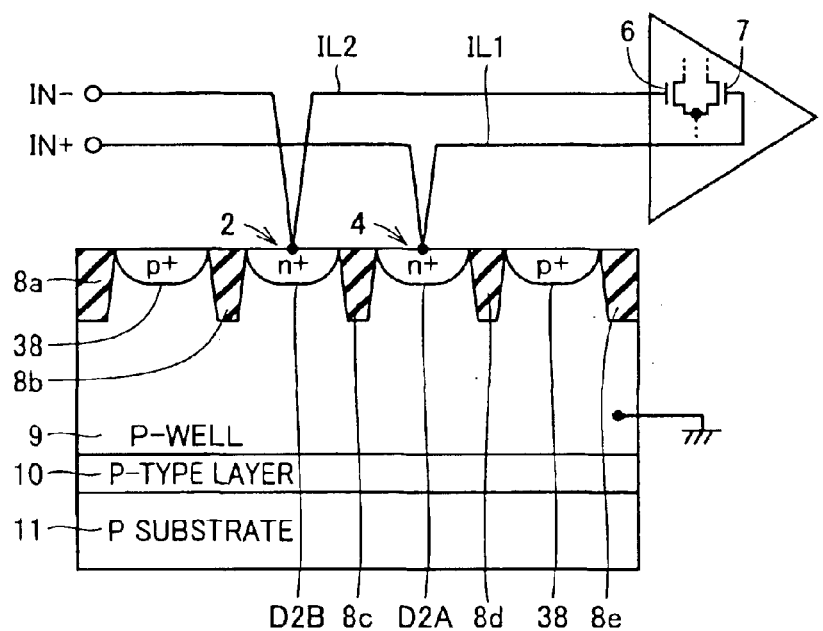
FIG. 16 schematically shows a sectional structure of an arrangement shown in FIG. 15.

FIG. 16 is a diagram schematically showing the sectional structure along diodes 2 and 4 as shown in FIG. 15. In FIG. 16, corresponding to diodes 2 and 4, n-type impurity regions D2B and D2A are formed on the surface of P-well 9 at an interval. At an outer periphery of impurity regions D2B and D2A, p-type impurity region 38 of the same conductivity type with P-well 9 is formed. Between these impurity regions 2, 4 and 38, element isolation films 8a–8e are arranged, respectively. P-well 9 is formed on the surface of P-type layer 10, which in turn is formed on P substrate 11. Impurity regions D2A and D2B are connected to internal lines IL1 and IL2, respectively.

P type impurity region 38 is formed along the outer periphery of impurity regions D2B and D2A forming diodes 2 and 4, respectively. P-well 9 is biased, for example, to the ground voltage and impurity region 38 is also biased to the ground voltage level. When a noise is transmitted via the surface region of P-well 9, the noise can be absorbed by impurity region 38 and the noise transmitted to diodes 2 and 4 can be reduced in magnitude. Thus, even in the high-frequency region where the common mode rejection characteristics of differential MOS transistors 6 and 7 degrade, high noise immunity can be achieved.

Here, P-well 9 may be biased to the ground voltage via p-type impurity region 38. Then, it is not necessary to separately provide a region for setting the well bias and an efficient utilization of P-well 9 is achieved.

Modification

Figure 17:
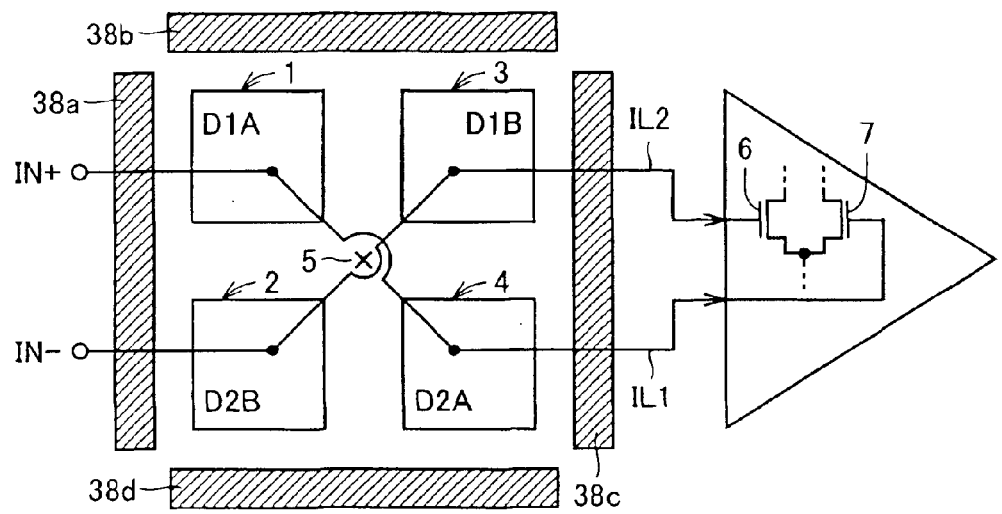
FIG. 17 schematically shows an arrangement of a modification of the fifth embodiment of the present invention.

FIG. 17 is a diagram showing a modification of the fifth embodiment of the present invention. The configuration as shown in FIG. 17 is different from the configuration as shown in FIG. 15 in the following point. Impurity regions 38a–38d are arranged along the four sides of the rectangle made by impurity regions D1A, D1B, D2B and D2A respectively forming diodes 1–4. In other words, in place of impurity region 38 continuously formed as shown in FIG. 15, divided impurity regions 38a–38d are arranged facing to the regions where diodes 1–4 are formed. The other construction of the configuration shown in FIG. 17 is the same as the configuration shown in FIG. 15, the corresponding portions will be denoted by the same reference numerals and the description thereof will not be repeated.

Also in the arrangement as shown in FIG. 17, impurity regions 38a–38d for noise absorption are arranged corresponding to impurity regions D1A, D1B, D2B and D2A forming diodes 1–4, and the noise transmitted via the surface of P-well 9 is absorbed by divided impurity regions 38a–38d.

In addition, impurity regions 38a–38d each merely extend linearly, thus facilitating the patterning thereof.

These impurity regions 38a–38d have the same sectional structure as shown in FIG. 16 and are each biased to a predetermined voltage (ground voltage) via P-well 9, or receive a predetermined voltage to bias P-well 9 to a predetermined voltage (ground voltage).

Here, in FIGS. 15 and 17, two diodes are connected to each of internal lines IL1 and IL2 and the centers of gravity of diodes connected to the respective internal lines coincide. However, any arrangements of diodes shown in above described first to fourth embodiments may be used for the arrangement of diodes. It is possible to suppress the noise propagation to the diodes through the arrangement of impurity region(s) the same in conductivity type as the substrate region for the noise absorption along the outer periphery of the region where diodes are formed.

As described so far, according to the fifth embodiment of the present invention, impurity region(s) the same in conductivity type as the substrate region (well region) is (are) arranged along the outer periphery of the diodes for discharging accumulated electric charges, whereby the noise propagated along the well region or the surface of the substrate can be suppressed so as not to reach the diode, and the high noise immunity can be achieved.

Sixth Embodiment

Figure 18:
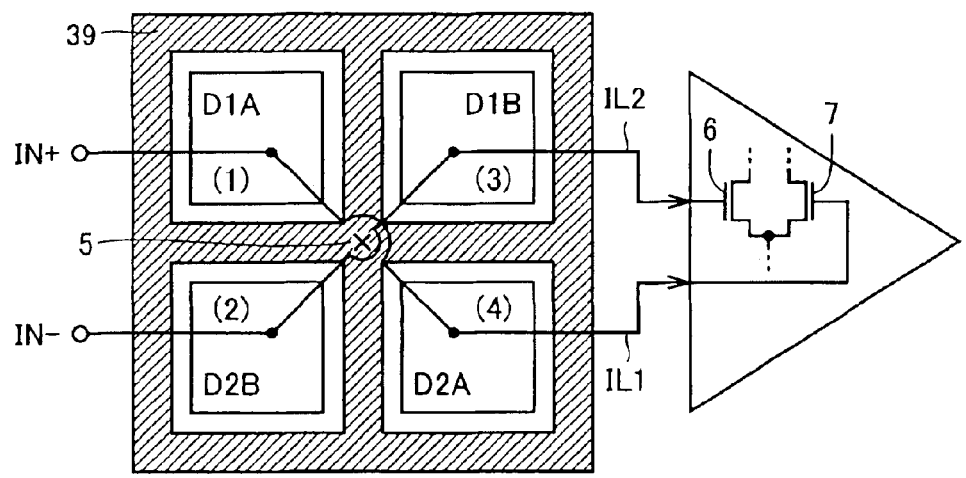
FIG. 18 schematically shows a structure of a semiconductor device according to a sixth embodiment of the present invention.

FIG. 18 is a diagram schematically showing a configuration of a semiconductor device according to the sixth embodiment of the present invention. In the configuration as shown in FIG. 18, impurity region 39 is formed outside the regions forming diodes 1–4. Impurity region 39 is formed in a meshed shape such so as to surround respective impurity regions D1A, D2B, D1B and D2A of diodes 1–4. The other construction of the semiconductor device shown in FIG. 18 is the same as the construction of the semiconductor device shown in FIG. 15 and the corresponding portions will be denoted by the same reference numerals and the detailed description thereof will not be repeated.

Figure 19:
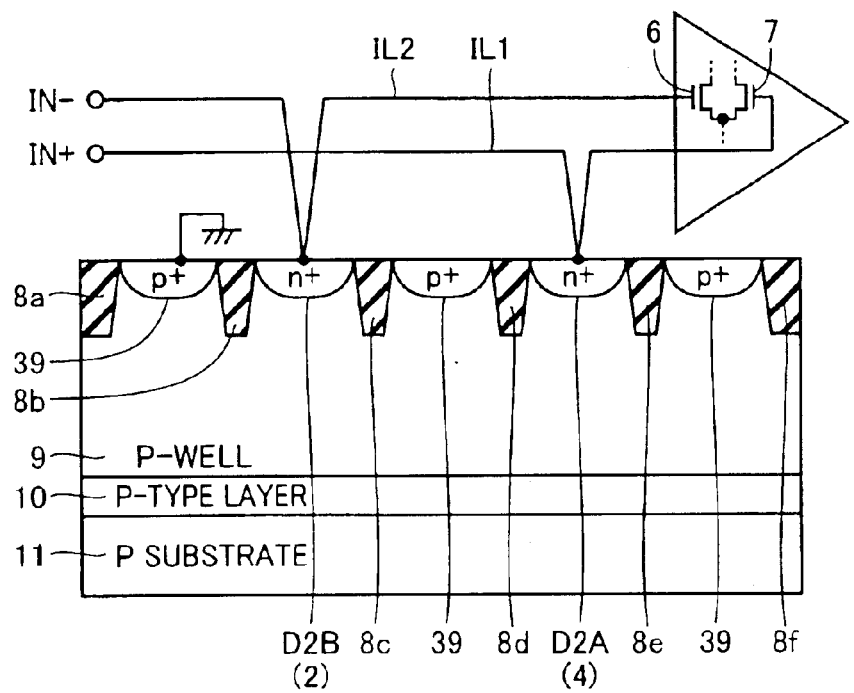
FIG. 19 schematically shows a sectional structure of diodes shown in FIG. 18.

FIG. 19 is a diagram schematically showing the sectional structure of the region including diodes 2 and 4 shown in FIG. 18. In FIG. 19, impurity regions D2B and D2A forming diodes 2 and 4, respectively, are formed on the surface of P-well 9 at an interval. Further, p-type impurity region(s) 39 is (are) formed so as to sandwich each of impurity regions D2B and D2A. Impurity regions 39, D2B and D2A are isolated from each other by element isolation films 8b–8e. On the outer periphery of impurity region 39, element isolation films 8a and 8f are formed. Impurity region 39 is fixed, for example, to the ground voltage and P-well 9 is biased to the ground voltage level, accordingly. The other construction of the sectional structure shown in FIG. 19 is the same as the construction of the sectional structure shown in FIG. 16 and the corresponding portions will be denoted by the same reference numerals and the detailed description thereof will not be repeated.

As shown in FIGS. 18 and 19, with impurity region 39 being arranged so as to surround each of impurity regions D1A, D1B, D2B and D2A forming diodes 1–4, respectively, noise propagated to each of the impurity regions can be securely absorbed by impurity region 39 and the noise immunity can be improved. In addition, P-well 9 is biased, for example, to the ground voltage by impurity region 39, the power supply to P-well 9 can be enhanced to suppress a potential distribution in P-well 9. Thus, diodes 1–4 formed in P-well 9 can be securely maintained in a reverse bias state, allowing further suppression of the noise propagation to internal line via diodes 1–4.

In addition, impurity region 39 can be used as an anode electrode of diodes 1–4, reducing the parasitic resistance of P-well 9, allowing high speed discharging of accumulated electric charges on internal lines IL1 and IL2.

Here, in the configuration as shown in FIG. 19, P-well 9 is biased to the ground voltage level via impurity region 39. However, P-well 9 may be biased to the ground voltage level from its own region. Also in this case, as impurity region 39 is a high-concentration impurity region, and is low in electrical resistance, the electrical resistance on the surface of P-well 9 can be reduced and the voltage distribution in P-well 9 can be suppressed accordingly.

Modification

Figure 20:
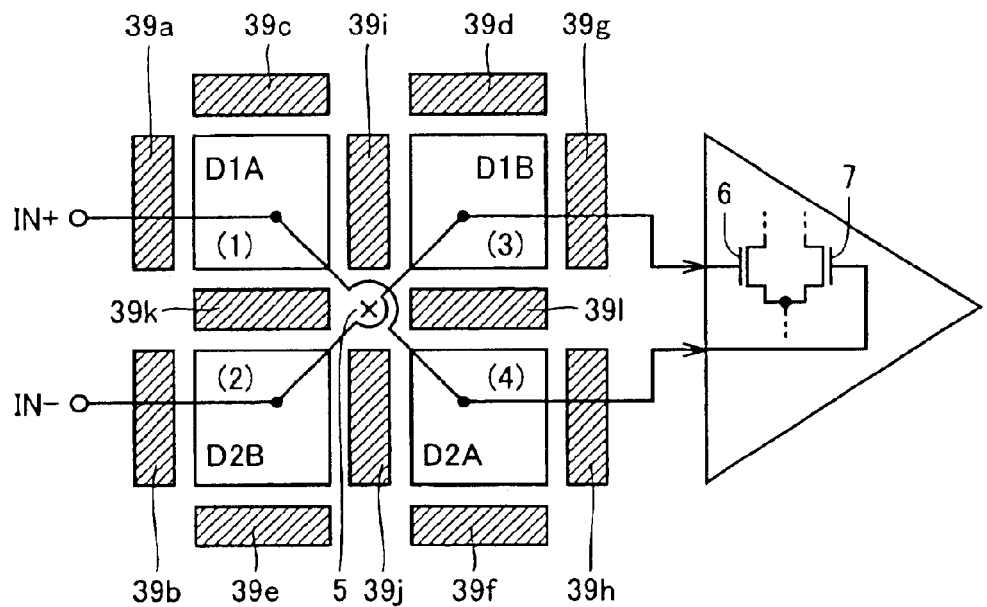
FIG. 20 shows a modification of a sixth embodiment of the present invention.

FIG. 20 is a diagram schematically showing an arrangement of a modification of the sixth embodiment of the present invention. In the arrangement as shown in FIG. 20, impurity regions 391a–39l are arranged corresponding to impurity regions D1A, D1B, D2B and D2A forming diodes 1–4, respectively. In other words, impurity region 39 shown in FIG. 18 is divided into impurity regions 39a–39l. The sectional structure of the arrangement shown in FIG. 20 is similar to the sectional structure shown in FIG. 19.

In the arrangement as shown in FIG. 20, divided impurity regions 39a–39l are arranged surrounding the regions respectively forming diodes 1–4. These impurity regions 39a–39l are formed into rectangular regions extending linearly, and can be patterned easily.

Impurity regions 39a–39l as shown in FIG. 20 may be supplied with ground voltage from different ground lines, respectively, or fixed to ground voltage level by P-well 9. Also in the arrangement shown in FIG. 20, impurity regions 39a–39l of the same conductivity type as P-well 9 are arranged surrounding impurity regions D1A, D1B, D2B and D2A, and noise transmission to diodes 1–4 via P-well 9 can be securely prevented.

Further, it is possible to reduce the substrate resistance of P-well 9 as in the arrangement shown in FIG. 18 through utilization of impurity regions 39a–39l as anodes of diodes 1–4.

As described so far, according to the sixth embodiment of the present invention, impurity region the same in conductivity type as the substrate well region is arranged surrounding each of impurity regions forming diodes, and secure suppression of noise propagation to the diode can be achieved. Further, as the impurity region for the noise absorption is of the same conductivity type as the substrate well region, by using this noise absorbing region as electrodes of the diodes, well resistance can be reduced and the response speed of diodes can be improved.

Seventh Embodiment

Figure 21:
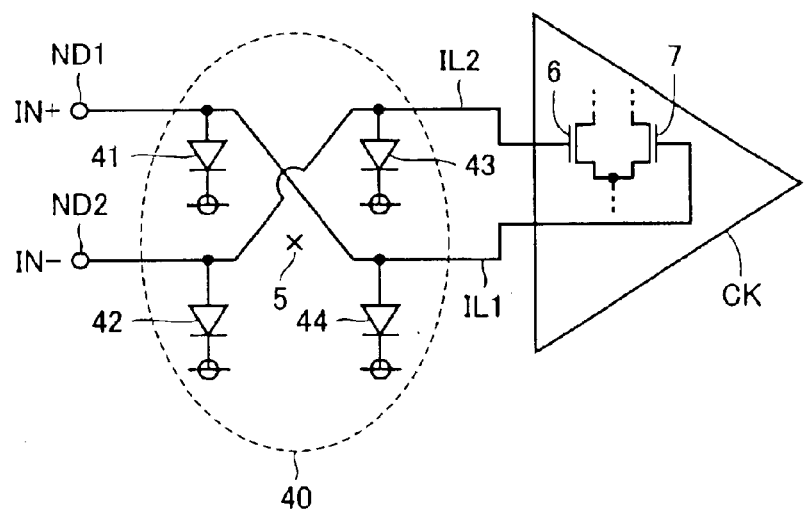
FIG. 21 schematically shows a configuration of a semiconductor device according to a seventh embodiment of the present invention.

FIG. 21 is a diagram schematically showing a configuration of a semiconductor device according to the seventh embodiment. In FIG. 21, diodes 41 and 44 are connected to internal line IL1 transmitting input signal In+ on node ND1 to the gate of MOS transistor 7 and diodes 42 and 43 are connected to internal line IL2 transmitting input signal In− on node ND2 to the gate of MOS transistor 6. These diodes 41–44 are arranged in the common centroid manner such that the diode groups share the position 5 of the center of gravity.

Diodes 41–44 are formed in N-well 40. Hence, anodes of diodes 41 and 44 are connected to internal line IL1 and anodes of diodes 42 and 43 are connected to internal line IL2. N-well 40 is formed in P-well 9 where another transistor is formed. N-well 40 is connected, for example, to the power voltage to set diodes 41–44 in a reverse biased state. Also in the configuration as shown in FIG. 21, plasma charged particles accumulated on internal line IL1 or IL2 are discharged to N-well 40 of the substrate region via diodes 41–44.

Figure 22:
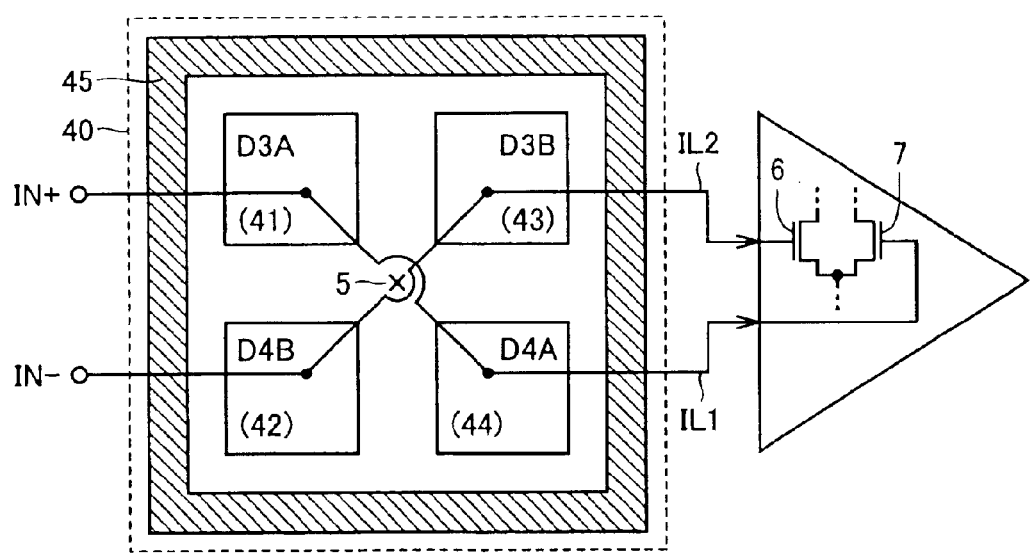
FIG. 22 schematically shows a planar layout of diodes shown in FIG. 21.

FIG. 22 is a diagram schematically showing the planar layout of diodes 41–44 shown in FIG. 21. In FIG. 22, P type impurity regions D3A, D3B, D4B and D4A are arranged, in a matrix of two rows by two columns, corresponding to diodes 41–44. Impurity regions D3A, D3B, D4B and D4A are of the same size (area). Impurity regions on the diagonal line of the matrix are connected to a common internal line, to achieve the common centroid arrangement where the position 5 of center of gravity is shared between the diode groups.

N-type impurity region 45 is arranged so as to surround impurity regions D3A, D3B, D4B and D4A. Impurity regions 45, D3A, D3B, D4B and D4A are formed in N-well 40. Hence, the noise propagation from P-well 9 and P-type layer 10 can be suppressed by N-well 40 and even when the noise is transmitted to N-well 40 via impurity region 45, the propagation of the noise to diodes 41 and 44 will be prevented. By the use of N-well 40, for a noise propagation from any of the side surface or the bottom surface to the substrate region of the diode, the noise propagation to diodes 41–44 can be securely suppressed.

Further, impurity regions D3A and D4A are connected to internal line IL1 and impurity regions D4B and D3B are connected to internal line IL2. Internal line IL1 and IL2 transmit input signals In+ and In− to the gates of MOS transistors 7 and 6, respectively. Hence, the substrate noise propagation to diodes 41–44 can be suppressed and a precise differential amplification of input signals In+ and In− is allowed. Diodes 41–44 discharge negative, accumulated plasma charges to the substrate region by the backward leakage current, and turn conductive to discharge positive, accumulated charges to the N-well of the substrate region through forward current.

Figure 23:
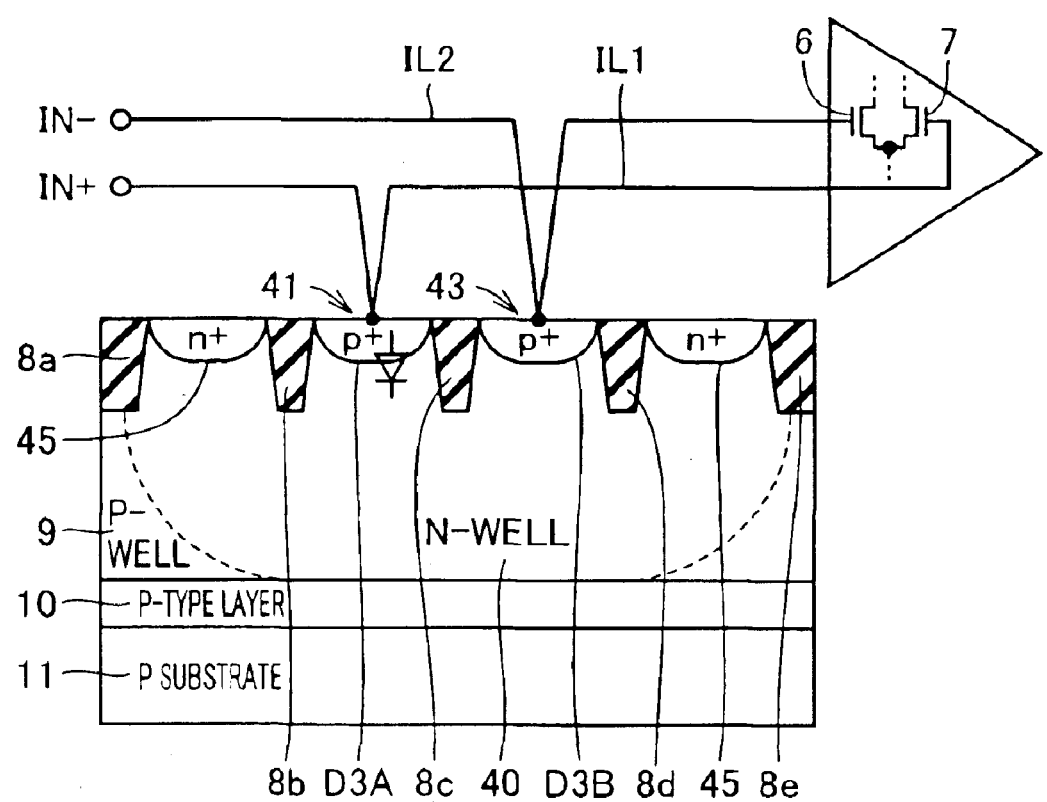
FIG. 23 schematically shows a sectional structure of the diodes shown in FIG. 22.

FIG. 23 is a diagram schematically showing the sectional structure of the region including impurity regions D3A and D3B shown in FIG. 22. N-well 40 is formed in P-well 9. N-well 40 is formed being, at bottom portion, in contact with P-type layer 10 and the region for diode formation is securely isolated from the region for formation of other elements.

On the surface of N-well 40, p-type impurity layers D3A and D3B are formed at an interval. Further, in a peripheral portion of the surface of N-well 40, n-type impurity layer 45 is formed. Impurity regions 41, 43 and 45 are isolated from each other by element isolation films 8a and 8e. Further element isolation films 8a and 8e are formed along a boundary portion of N-well 40 to isolate a transistor element or a well in P-well 9 from N-well 40.

Impurity regions D3A and D3B are connected to internal lines IL1 and IL2, respectively, and function as anodes of diodes 41 and 43. N-well 40 functions as cathodes for diodes 41 and 43. N-well 40 is maintained at a power supply voltage level by, for example, maintaining impurity region 45 at a power supply voltage level, thereby setting diodes 41 and 43 in a reverse biased state.

When N-well 40 is biased to a power supply voltage level, P-well 9 and N-well 40 turn into a reverse biased state, whereby the noise propagation from P-well 9 to N-well 40 can be suppressed.

Further, impurity region 45 formed in N-well 40 may be formed into geometry of surrounding each of impurity regions forming diodes 41–44, as shown in FIG. 18 or FIG. 20, or impurity regions 45 may be divided and arranged along the outer periphery of the regions forming diodes 41–44.

As described so far, according to the seventh embodiment of the present invention, the diodes are formed in the dedicated well region, whereby the noise propagation from the substrate region to the diodes can be securely suppressed. In particular, among noises propagating via the surface of P-well 9, a noise transmitted through the neighborhood of the interface region of P-well 9 and P-type layer 10 and propagated from the bottom portion of the substrate region for forming the diodes can securely be suppressed.

Eighth Embodiment

Figure 24:
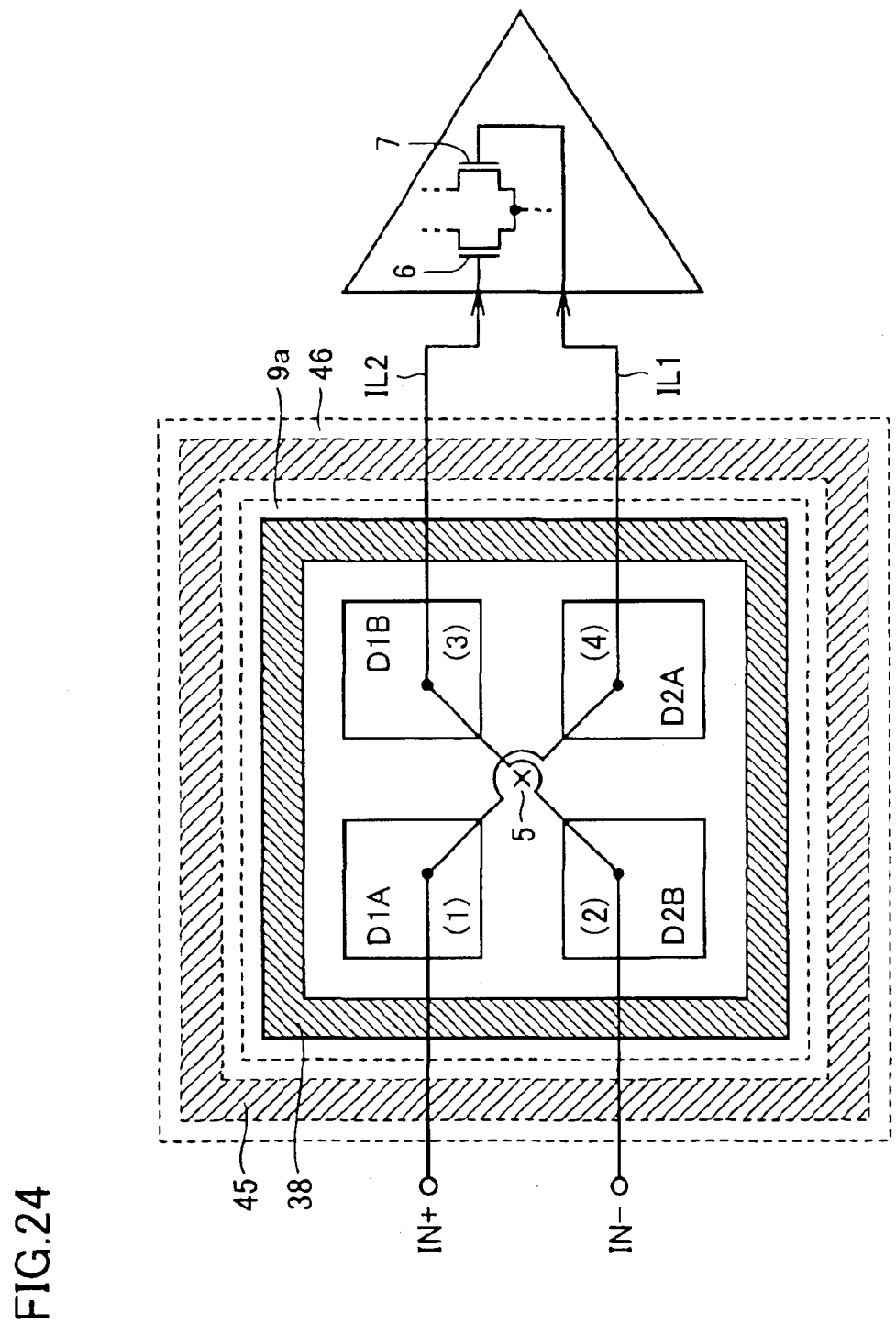
FIG. 24 schematically shows a configuration of a semiconductor device according to an eighth embodiment of the present invention.

FIG. 24 is a diagram schematically showing the construction of the semiconductor device according to the eighth embodiment of the present invention. In FIG. 24, impurity regions D1A, D1B, D2B and D2A forming diodes 1–4, respectively, are arranged in alignment in two columns by two rows. For absorption of noise, p-type impurity region 38 is formed along the outer periphery of the region where diodes 1–4 are formed. Impurity regions 38, D1A, D1B, D2B and D2A are formed on the surface of P-well 9a. The arrangement of these regions is the same as that shown in FIG. 15. N-well 46 is formed outside P-well 9a so as to surround P-well 9a. On the surface of N-well 46, n-type impurity region 45 is formed. Via n-type impurity region 45, N-well 46 is biased to a sufficiently high voltage, for example, to the power supply voltage level. P-well 9a is fixed, for example, to the ground voltage level by impurity region 38 so as to set P-well 9a and N-well 46 in a reverse biased state. Thus, as P-well 9a is isolated from the power supply line, power supply noise can be prevented from being transmitted to internal lines IL1 or IL2 via diodes 1–4. In addition, even when the substrate noise is transmitted from N-well 46 to P-well 9a, the noise propagation to diodes 1–4 can be prevented by impurity region 38.

Figure 25:
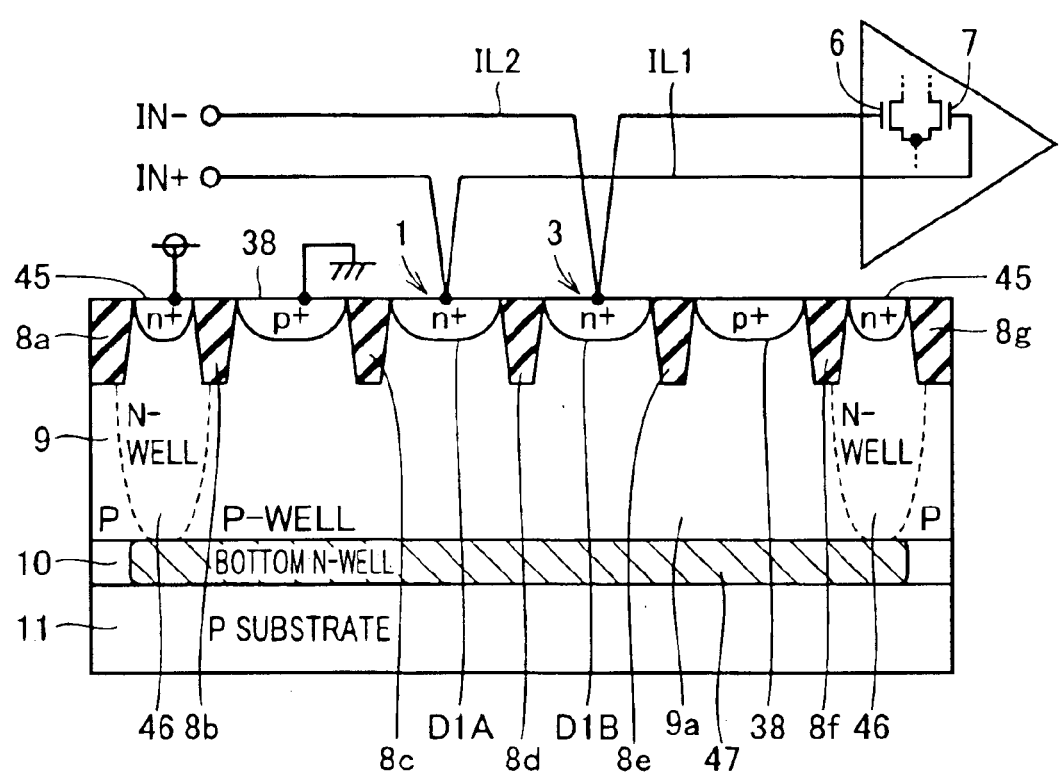
FIG. 25 schematically shows a sectional structure of diodes shown in FIG. 24.

FIG. 25 is a diagram schematically shown the sectional structure of a region including impurity regions D1A and D1B shown in FIG. 24. In FIG. 25, n-type impurity regions D1A and D1B are formed on the surface of P-well 9a at an interval. Outside these impurity regions D1A and D1B, p-type impurity region 38 is formed via element isolation films 8c and 8e.

Outside P-well 9a, N-well 46 is formed to the same depth as P-well 9a. On the surface of N-well 46, n-type impurity region 45 separated from impurity region 38 by element isolation films 8b and 8f is formed. As an example, n-type impurity region 45 is set to the power supply voltage level and P-well 9a is fixed to the ground level by impurity region 38. Thus, P-well 9a and N-well 46 are set to a reverse biased state. Further, a bottom N-well 47 is formed in the region below P-well 9a and N-well 46 of P-type layer 10. Thus, P-well 9a where diodes 1–4 are formed is securely isolated from the region where other transistors are formed. Bottom N-well 47 is fixed, for example, to power supply voltage level via N-well 46. Hence, for diodes 1–4, noise propagating from the bottom portion of P-well 9a can be absorbed by bottom N-well 47 and N-well 46 whose potentials are fixed.

Outside N-well 46, P-well 9 is formed for forming components of other circuitry.

P-well 9a is isolated from the power supply line and the noise on the power supply line supplying the power supply voltage biasing N-well 46 can be prevented from reaching P-well 9a. Accordingly, power supply noise can be prevented from riding on internal lines IL1 and IL2. Thus, the noise immunity of the internal circuit can significantly be improved.

Further, the voltage biasing N-well 46 and P-well 9a is not limited to the power supply voltage or the ground voltage and any voltage level can be employed, as far as P-well 9a and N-well 46 are set in a reverse biased state and diodes 1–4 are set in a reverse biased state.

Further, as the arrangement of diodes, an arrangement according to any of the first to fourth embodiment as described above may be used.

As described so far, according to the eighth embodiment of the present invention, the substrate well region where the diodes discharging plasma charged particles are formed is formed being surrounded by a well region of another conductivity type. Accordingly, the diode forming region can be isolated from the substrate region of another circuit and the noise propagation to the diodes can be suppressed. In addition, the diode forming region can be isolated from the power supply line and therefore, the power supply noise can be prevented from being transmitted to the differential stage of the internal circuit via the diodes.

Ninth Embodiment

Figure 26:
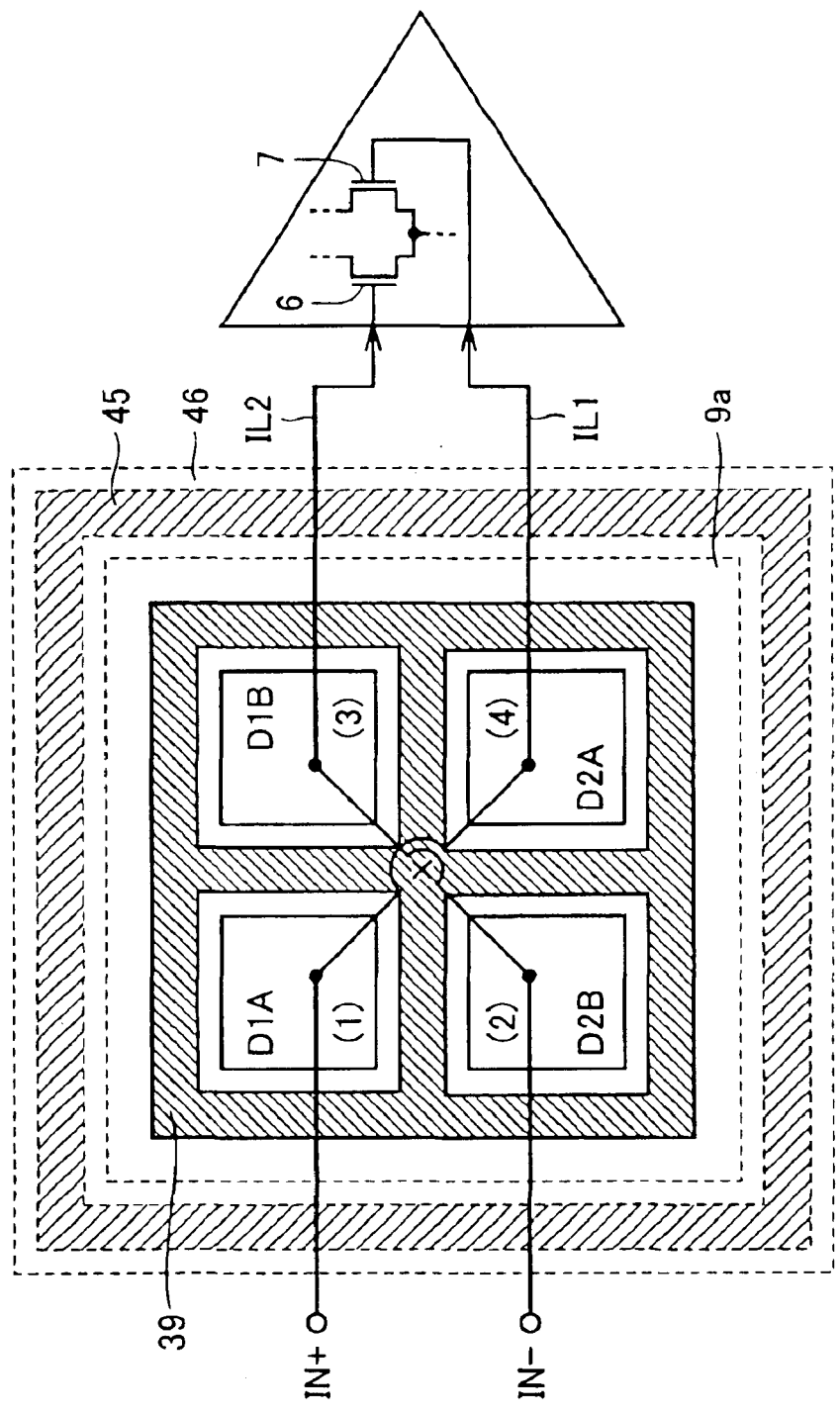
FIG. 26 schematically shows a configuration of a semiconductor device according to a ninth embodiment of the present invention.

FIG. 26 is a diagram schematically showing a planar layout of the semiconductor device according to the ninth embodiment of the present invention. The planar layout as shown in FIG. 26 is different from the structure as shown in FIG. 20 in the following point. In place of impurity region 38 formed surrounding the region forming diodes 1–4, impurity region 39 is formed individually surrounding impurity regions D1A, D1B, D2B and D2A forming diodes 1–4, respectively. The other structure shown in FIG. 26 is the same as the structure shown in FIG. 24 and the corresponding portions will be denoted by the same reference numerals and the detailed description thereof will not be repeated.

Impurity region 39 is employed also for fixing the potential of lower P-well 9a, for example, to the ground voltage level.

Figure 27:
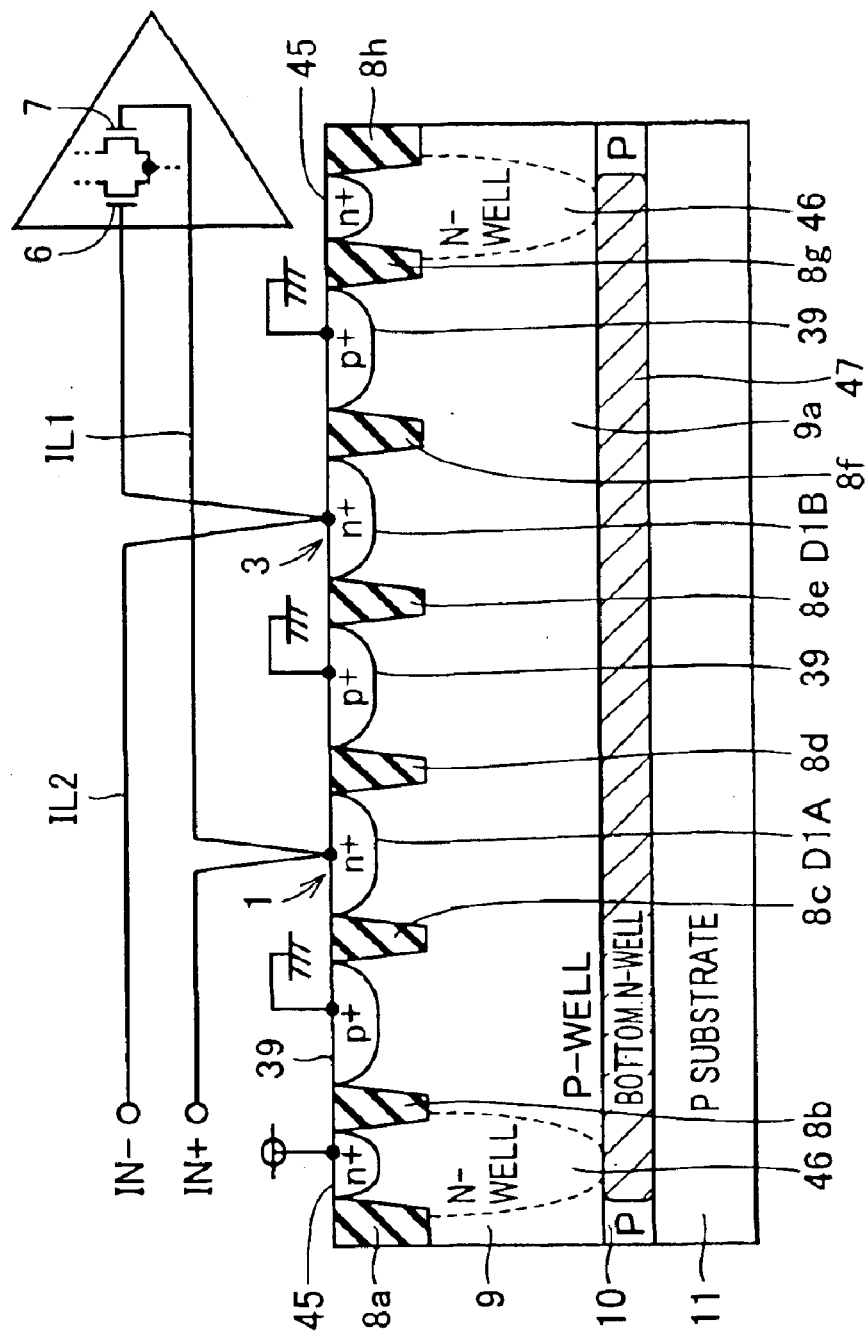
FIG. 27 schematically shows a sectional structure of diodes shown in FIG. 26.

FIG. 27 is a diagram schematically showing the sectional structure of a portion including impurity regions D1A and D1B shown in FIG. 26. The sectional structure shown in FIG. 27 is different from the sectional structure shown in FIG. 25 in the following point. Between n-type impurity regions D1A and D1B, p-type impurity region 39 is formed. Impurity regions D1A and D1B are isolated from p-type impurity region 39 by element isolation films 8b and 8e. On the periphery of P-well 9a, p-type impurity region 39 is arranged in the same manner as in the structure shown in FIG. 25. The p-type impurity region 39 is, for example, fixed to the ground voltage level.

The other arrangement in the sectional structure shown in FIG. 27 is the same as in the structure shown in FIG. 25 and the corresponding portions will be denoted by the same reference numerals and the detailed description thereof will not be repeated.

As shown in FIG. 27, p-type impurity regions 39 are arranged in a distributed manner on the surface of P-well 9a.

Hence, by fixing impurity regions 39, for example, to the ground voltage level, the potential of P-well 9a can be fixed, for example, to the ground voltage level and diodes 1 and 3 (or 2 and 4) can securely be maintained at a reverse biased state, whereby an adverse influence on internal signals In+ and In− can be prevented.

Further, also in the arrangement as shown in FIGS. 26 and 27, it is merely required to arrange the diodes in the common centroid manner and the number and the arrangement manner of the diodes are determined desirably.

As described so far, according to the ninth embodiment of the present invention, impurity regions for forming the diodes are formed being surrounded individually by the impurity regions of the different conductivity type and the substrate well region can be securely fixed to a predetermined potential (ground potential) level. Thus, it is possible to securely suppress the transmission of substrate noise to internal line IL1 and IL2 via the diodes and the input signals are securely transmitted to the differential MOS transistors of internal circuits.

Tenth Embodiment

Figure 28:
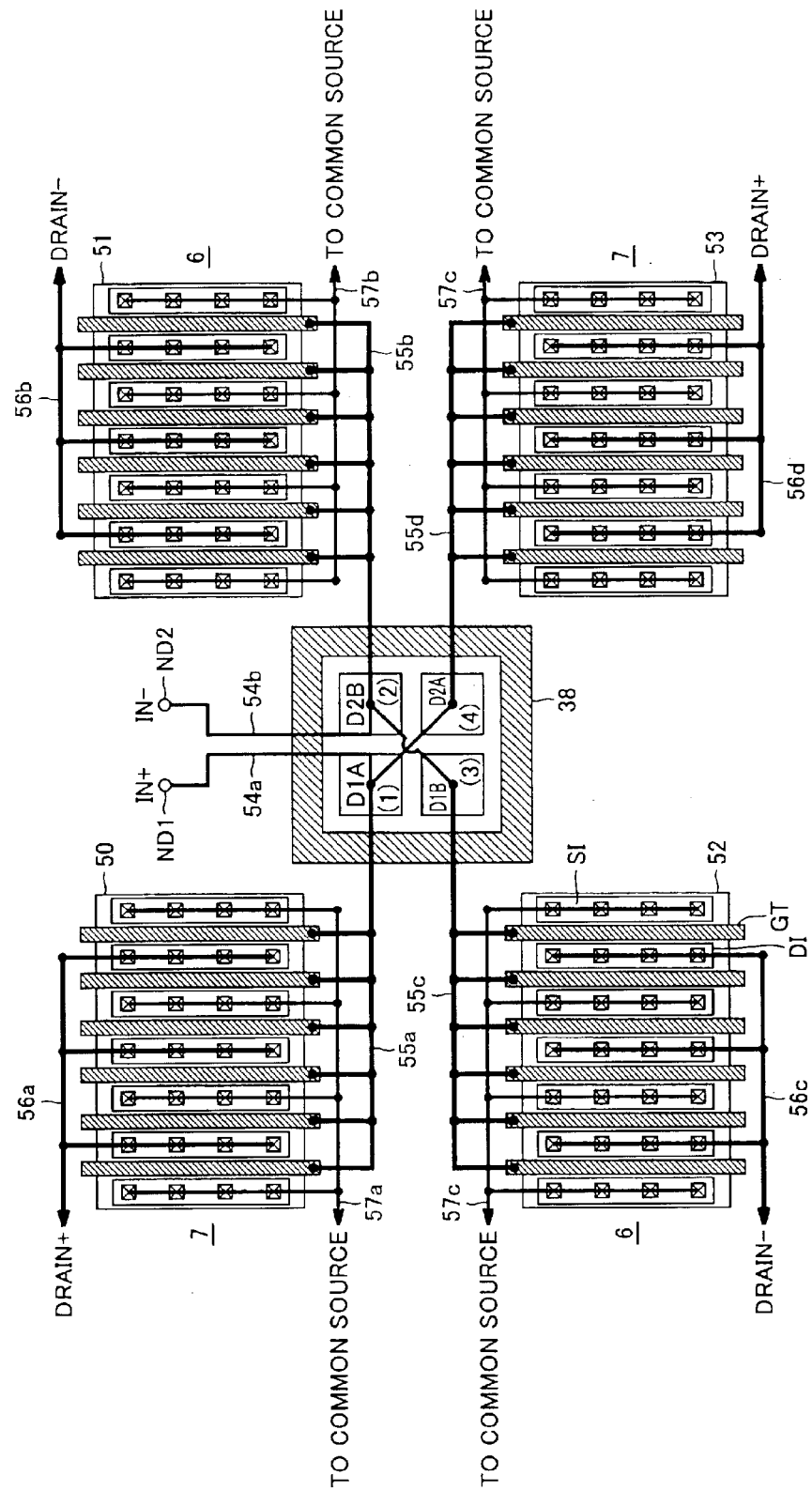
FIG. 28 schematically shows a planar layout of a semiconductor device according to a tenth embodiment of the present invention.

FIG. 28 is a diagram schematically showing a planar arrangement of the semiconductor device according to the tenth embodiment of the present invention. In FIG. 28, impurity regions D1A, D2B, D1B and D2A are arranged, in alignment in two rows by two columns, for forming diodes 1–4. Impurity region 38 is formed surrounding the region where diodes 1–4 are formed. Impurity regions D1A and D2A are connected to node ND1 via internal line 54a. Impurity regions D2B and D1B are connected to node ND2 via internal line 54b.

Active regions 50–53 for forming transistors 6 and 7 are symmetrically arranged so as to surround the region where diodes 1–4 are formed. Unit transistors for constructing MOS transistor 7 are formed in active regions 50 and 53 arranged opposite with each other on the diagonal line. Additionally, unit transistors for constructing MOS transistor 6 are arranged in active regions 51 and 52 arranged opposite with each other on another diagonal line. In each of these active regions 50–53, a source impurity region SI and a drain impurity region DI are alternately arranged. Between source impurity region SI and drain impurity region DI, a gate electrode GT is arranged. In FIG. 28, reference characters SI, DI and GT are indicated only for active region 52 for the simplification of the drawing.

In active region 50, the drain impurity regions are connected together via a metal line 56a and coupled to a drain+node. In addition, the source impurity regions are connected together via a metal line 56b and coupled to a common source node. Gate electrodes GT are electrically connected to impurity region D1A via a metal line 55a.

In active region 51, the drain impurity regions are commonly connected via metal line 56b and coupled to a drain−terminal. Gate electrodes GT are electrically connected to impurity region D2B via a metal line 55b. The source impurity regions are connected together via a metal line 57b and coupled to the common source node.

In active region 52, gate electrodes GT are connected together via metal line 55c and electrically connected to impurity region D1B. Drain impurity regions DI are connected together via metal line 56c and connected to the drain−node. In addition, the source impurity regions SI are connected together via a metal line 57c and connected to the common source node.

In active region 53, the gate electrodes are connected together via metal line 55b and connected to impurity region D2A and the drain impurity regions are connected together via metal line 56e and connected to the drain−terminal. The source impurity regions are connected together via metal line 57c and coupled to the common source node.

Metal lines 57a–57d are in an upper interconnection layer above metal lines 55a–55d and 56a–56d.

Active regions 50–53 for forming transistors 6 and 7 are arranged in the same size and layout in a point symmetrical arrangement with respect to the position of center of gravity of the diodes. The position of the center of gravity of active regions 51 and 52 forming transistor 6 coincides with the position of the center of gravity of active regions 50 and 53 forming transistor 7. In addition, by making the position of the center of gravity of the diodes and the position of the center of gravity of transistors coincident, it is possible to symmetrically arrange the transistors and the diodes with respect to the position of the center of gravity. Consequently, it is possible to make the layouts of the internal lines between the transistor forming regions and the respective diode forming regions symmetrical, whereby the layout is simplified.

In addition, as the transistor elements forming the differential transistors are arranged in a common centroid manner, the influence of residual noise on the transistors can be made equal, whereby noise immunity can be improved.

In addition, by arranging active regions 50–53 forming transistors symmetrically in neighborhood of the regions forming diodes 1–4, so as to surround these diode forming regions, the interconnection distance of metal lines 55a–55d connecting the impurity regions of the diodes and the corresponding transistor gates can be reduced to reduce the accumulated charge amount at the time of plasma generation. In particular, by linearly arranging metal lines 55a–55d, the length of the interconnection can be made short to reduce the antenna effect, to thereby suppress the influence of residual charges that can not be cancelled by diodes 1–4.

Figure 29:
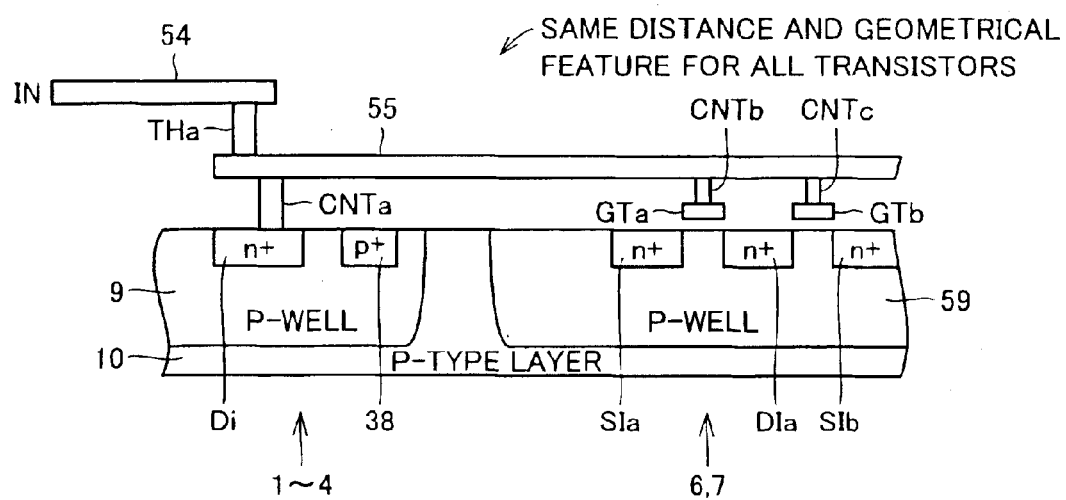
FIG. 29 schematically shows a sectional structure of an interconnection between a diode and a transistor as shown in FIG. 28.

FIG. 29 is a diagram schematically showing the sectional structure of diodes 1–4 and transistors 6 and 7 shown in FIG. 28. In FIG. 29, the structure of one impurity region DI among the impurity regions corresponding to diodes 1–4 and an active region of one transistor is shown as a representative.

In FIG. 29, P-wells 9 and 59 are formed at an interval on the surface of P-type layer 10. On the surface of P-well 9, n-type impurity region DI and p-type impurity region 38 for the noise absorption are formed. Impurity region DI corresponds to one of impurity regions D1A, D1B, D2B and D2A shown in FIG. 28.

In P-well 59, an n-type impurity region, source impurity region SIa, a drain impurity region DI and a source impurity region SIb are formed alternately at intervals. In a well region between these impurity regions, gate electrodes GTa and GTb are formed with a gate insulation film not shown interposed. P-well 59 corresponds to one of active regions 50–53 shown in FIG. 28.

An impurity region Di formed in P-well 9 is electrically connected to metal line 55 via a contact CNTa. Metal line 55 is further connected to metal line 54 connected to a node transmitting input signal IN via a contact THa. Metal line 55 is arranged linearly extending to the transistor forming region of P-well 59 and being electrically connected to gate electrodes GTa and GTb via contacts CNTb and CNTc.

Metal line 54 is in an upper interconnection layer above metal line 55. Metal line 55 is a metal line in the lowest interconnection layer among the available interconnection lines arranged in the neighborhood of the diode forming region (P-well 9) and, for example, a first aluminum interconnection line or a first copper interconnection line. Through the use of a lowest interconnection line available in the neighborhood for interconnection between the diode and the associated transistor, the influence of plasma charged particles can be reduced which are generated during plasma etching in forming an upper interconnection lines, performed subsequent to the plasma etching in forming the interconnection line 55. More specifically, when a metal line of an upper interconnection layer is utilized for the metal line connecting the diode and the associated transistor, it is necessary to connect the upper layer metal line with the gate electrode of the transistor and the impurity region of the diode using intermediate interconnection lines, in order to reduce the aspect ratio of the contact to the gate electrode of the transistor. Hence, the number of plasma etching steps related to the gate electrode of the transistor increases and the influence of the plasma charged particles increases. By utilizing the metal line in the lowest interconnection layer, the connection of gate electrodes GTa and GTb and impurity region DI of the diode can be completed at an earlier stage, whereby the influence of the plasma etching on gate electrodes GTa and GTb can be reduced.

Metal line 54 in the upper interconnection layer is connected only to internal node ND1 or ND2 and can be short in interconnection length to have the accumulated charge amount in plasma etching step sufficiently small. Hence, it is possible to sufficiently inhibit accumulated electric charges on metal line 54 from propagating via metal line 55 to exert a negative influence on gate electrodes GTa and GTb.

Further, the layout pattern of metal line 55 is made the same for all transistors (active regions 50–53). Therefore, for each transistor, the area of metal line 55 (55a–55d) becomes the same and the antenna effect on the transistor gate electrode can be made equal, whereby the effect of accumulated electric charges can be cancelled.

Further, as for the length of interconnection of metal line 55, through the common centroid arrangement of active regions 50–53, the length of metal lines 55 connecting the gate electrode of the transistor and the impurity region of the diode can be made equal for each of active regions 50–53, thereby making the accumulated charge amount substantially equal for each transistor. Hence, even when the noise charges are not all removed by diodes 1–4 and residual charges are left, the residual amount can be made equal and the characteristic difference between MOS transistors 6 and 7 can be eliminated.

Here, in the tenth embodiment, diodes may be arranged according to any of the arrangements of the first to ninth embodiments. In addition, in FIG. 29, P-well 59 for forming the transistor and P-well 9 for forming the diode are separately provided. However, the region for forming the impurity region of diode and the region for forming the gate electrode of the transistor may be a common well region. Further P-wells 9 and 59 may be isolated by an isolation region such as an N-well. Still further, an N-type buried isolation region may be employed.

As described so far, according to the tenth embodiment of the present invention, the transistor forming region is arranged in a common centroid manner near the associated diode forming region and the interconnection between the diode and the transistor can be made symmetrically. Further, the characteristics of the transistors can be made identical, to eliminate the difference in characteristics accordingly, whereby the input signals can be correctly amplified without the influence of the accumulated electric charges.

In the foregoing description, n-channel MOS transistors 6 and 7 are shown as an example of the differential amplification circuit. However, MOS transistors 6 and 7 may be p-channel MOS transistors. The transistor pair is only required to provide, as an output thereof, the result of complementary amplification of input signals In+ and IN−, and can be a differential stage of a mixer, or a circuit stage simply operating in a parallel manner. In addition, the differential stage may operate in an analog fashion or in a digital fashion.

Further, the diodes are each required to be set in a reverse biased state, and the bias voltage level of the substrate well region may desirably be determined according to the available voltage level.

In the foregoing description, all transistors in the active region is used for forming the differential pair transistor. However, a transistor for other use than the differential pair formation may be arranged in the active region. For example, it is possible to arrange a current source supplying a current to the differential pair transistor, which are each called a geometrical feature dummy for the improvement of uniformity of finish of the gate electrode of the transistor and active region. This also helps to achieve the uniformity of characteristics of the differential transistors themselves. Of course, the geometrical transistor may be commonized with a transistor for other purpose such as the current source to be arranged.

As described so far, according to the present invention, the diodes for removing the plasma accumulated charges on the gate interconnection line of the differential transistor pair are arranged in a common centroid manner. Hence, the noises transmitted to the gates of the differential transistor pair via the diodes can be made in-phase, and the influence of the noise can be cancelled through the common mode rejection characteristics of the differential transistor pair securely. Hence, the semiconductor device capable of correctly and stably processing an input signal can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first transistor;
    a second transistor arranged electrically in parallel with said first transistor;
    a first diode group including a plurality of diode elements connected electrically in parallel with each other to a first terminal of said first transistor; and
    a second diode group including a plurality of diode elements electrically connected in parallel with each other to a first terminal of said second transistor, a center of gravity made by the diode elements in said second diode group overlapping in position with a center of gravity made by the diode elements in said first diode group.

2. The semiconductor device according to claim 1, wherein the first and second transistors each have a second terminal connected to a common node.

3. The semiconductor device according to claim 1, wherein the first and second transistors each receive, at the first terminal, a different internal signal via a different internal line.

4. The semiconductor device according to claim 1, wherein the first and second transistors each comprise an insulated gate field effect transistor and said first terminal is a control electrode node of said insulated gate field effect transistor.

5. The semiconductor device according to claim 1 wherein
the plurality of diode elements in said first diode group comprise a plurality of first impurity regions of a second conductivity type, arranged being spaced away from each other on a surface of a first semiconductor substrate region of a first conductivity type connected to a predetermined voltage, being connected to the first terminal of said first transistor,
the plurality of diode elements in said second diode group comprise a plurality of second impurity regions of the second conductivity type formed being spaced away from each other on the surface of said first semiconductor substrate region and connected to the first terminal of said second transistor, and
a position of center of gravity of said plurality of second impurity regions overlaps with a position of center of gravity of said plurality of first impurity regions.

6. The semiconductor device according to claim 5, wherein the first and second impurity regions are formed on the surface of said first semiconductor substrate region in a matrix of rows and columns.

7. The semiconductor device according to claim 6, wherein the first and second impurity regions are alternately arranged in said matrix of rows and columns.

8. The semiconductor device according to claim 5, wherein the first and second impurity regions are arranged one dimensionally in alignment.

9. The semiconductor device according to claim 8, wherein the first impurity regions are arranged with the second impurity regions being interposed in between.

10. The semiconductor device according to claim 5, wherein the first and second impurity regions are arranged corresponding to apexes of a rectangle so that the first impurity regions are arranged opposite with each other at positions of apexes on a first diagonal line of said rectangle and the second impurity regions are arranged opposite with each other at positions of apexes on a second diagonal line of said rectangle.

11. The semiconductor device according to claim 5, further comprising a third impurity region of the first conductivity type formed, in said first semiconductor substrate region, surrounding the first and second impurity regions.

12. The semiconductor device according to claim 11, wherein said third impurity region is arranged outside an entire of the first and second impurity regions.

13. The semiconductor device according to claim 11, wherein said third impurity region is formed surrounding each of the first and second impurity regions.

14. The semiconductor device according to claim 11, wherein said third impurity region is continuously formed.

15. The semiconductor device according to claim 11, wherein said third impurity region includes a plurality of divided regions formed separately from each other.

16. The semiconductor device according to claim 1, wherein a first substrate region for forming the diode elements of the first and second diode groups is different in conductivity type from a second substrate region for forming the first and second transistors, and said first substrate region is biased so as to set the diode elements in said first and second diode groups to a reverse biased state.

17. The semiconductor device according to claim 1, wherein
the diode elements in the first and second diode groups are formed commonly in a first substrate region of a first conductivity type,
said semiconductor device further comprises a second substrate region of a second conductivity type formed surrounding said first substrate region,
the first and second substrate regions are set to a reverse biased state, and
said second substrate region is different in conductivity type from a substrate region where the first and second transistors are formed.

18. The semiconductor device according to claim 1, wherein
the first and second transistors each include a plurality of transistor elements, the transistor elements being arranged surrounding a region where the diodes of the first and second diode groups are formed, and
a center of gravity of the transistor elements forming said first transistor overlaps in position with a center of gravity of the transistor elements forming said second transistor.

19. The semiconductor device according to claim 18, wherein
the plurality of diode elements in said first diode group comprise a plurality of first impurity regions arranged separate from each other on a surface of a substrate region,
the plurality of diode elements in said second diode group comprise a plurality of second impurity regions arranged separate from each other on the surface of said substrate region, and
an interconnection line connecting the transistor elements forming said first transistor and the first impurity regions is identical in at least one of length and geometrical feature to an interconnection line connecting the transistor elements forming said second transistor and the second impurity regions.

20. The semiconductor device according to claim 18, wherein an interconnection line connecting the transistor elements and corresponding impurity regions comprises an interconnection line in a lowest interconnection layer among available interconnection lines.

* * * * *